United States Patent
Ikeda

(10) Patent No.: US 6,529,264 B1
(45) Date of Patent: Mar. 4, 2003

(54) SUPPORT STRUCTURE FOR A PROJECTION EXPOSURE APPARATUS AND PROJECTION EXPOSURE APPARATUS HAVING THE SAME

(75) Inventor: Masatoshi Ikeda, Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/576,215

(22) Filed: May 23, 2000

Related U.S. Application Data

(63) Continuation of application No. PCT/JP98/05303, filed on Nov. 25, 1998.

(30) Foreign Application Priority Data

Nov. 25, 1997 (JP) ............................................. 9-323245

(51) Int. Cl.$^7$ ........................ G03B 27/42; G03B 27/52; G02B 7/02
(52) U.S. Cl. ............................ 355/53; 355/55; 359/819
(58) Field of Search ............................. 355/53, 72, 71, 355/67, 30, 55; 359/811, 819; 356/399, 400, 401

(56) References Cited

U.S. PATENT DOCUMENTS

| | | | |
|---|---|---|---|
| 4,690,528 A | | 9/1987 | Tanimoto et al. |
| 5,576,895 A | * | 11/1996 | Ikeda .......................... 359/811 |
| 5,877,843 A | * | 3/1999 | Takagi et al. .................. 355/30 |
| 6,008,885 A | * | 12/1999 | Takahashi et al. ............. 355/67 |
| 6,043,863 A | * | 3/2000 | Ikeda .......................... 355/53 |
| 6,128,069 A | * | 10/2000 | Korenaga ..................... 355/53 |
| 6,151,105 A | | 11/2000 | Lee .............................. 355/75 |

FOREIGN PATENT DOCUMENTS

JP  A-60-79358  5/1985

* cited by examiner

Primary Examiner—Russell Adams
Assistant Examiner—Peter B. Kim
(74) Attorney, Agent, or Firm—Oliff & Berridge, PLC

(57) ABSTRACT

A projection exposure apparatus for transferring a pattern on a mask onto a substrate, including a projection optical system having a first reflection optical element for bending an optical axis, a first optical system arranged between the mask and the first reflection optical element, and a second optical system arranged between the first reflection optical element and the substrate; a frame for integrally supporting a first barrel for holding the first optical system and a second barrel for holding the second optical system, and a connecting member for connecting the first barrel and the second barrel at positions different from the frame.

29 Claims, 16 Drawing Sheets

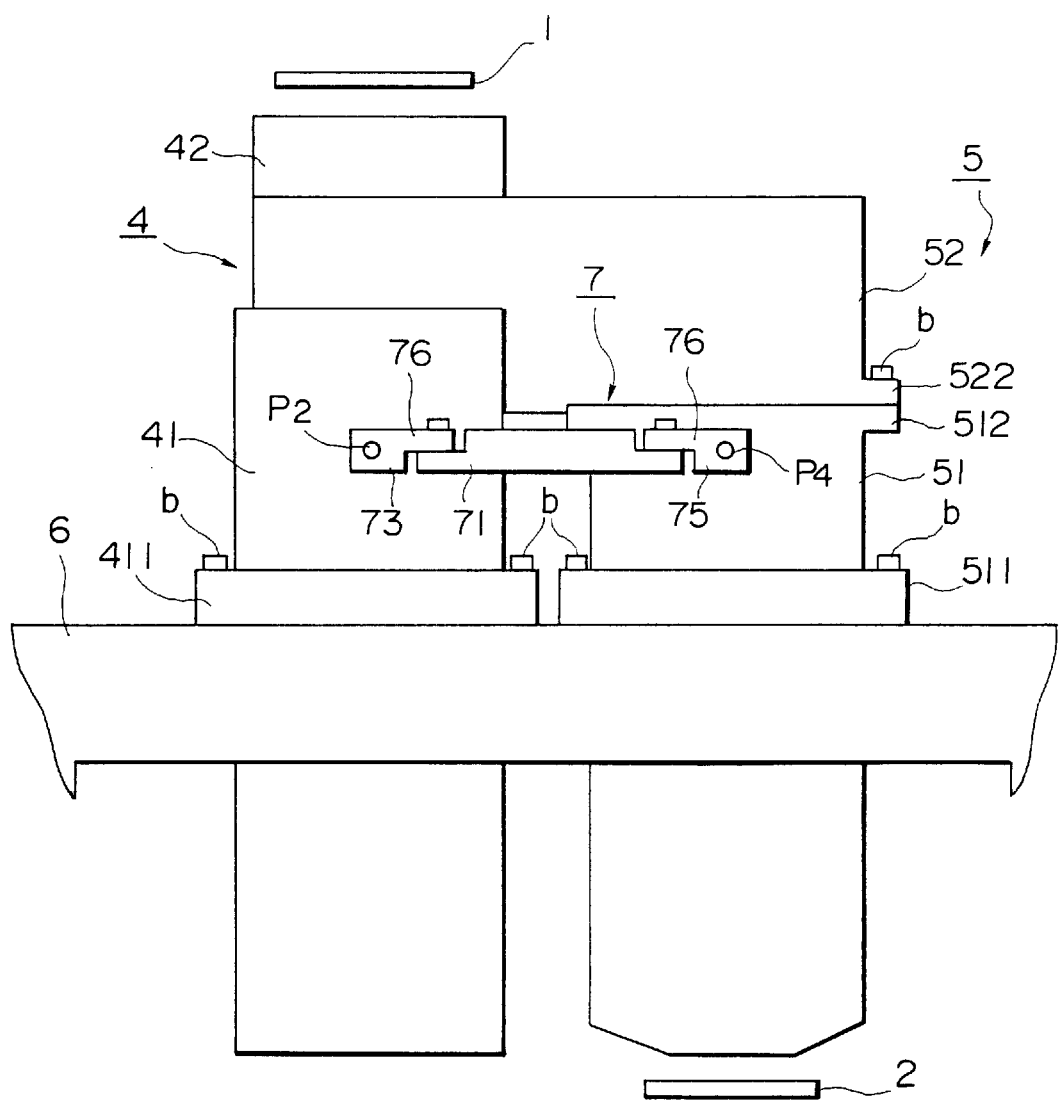
F I G. 6

F I G. 7
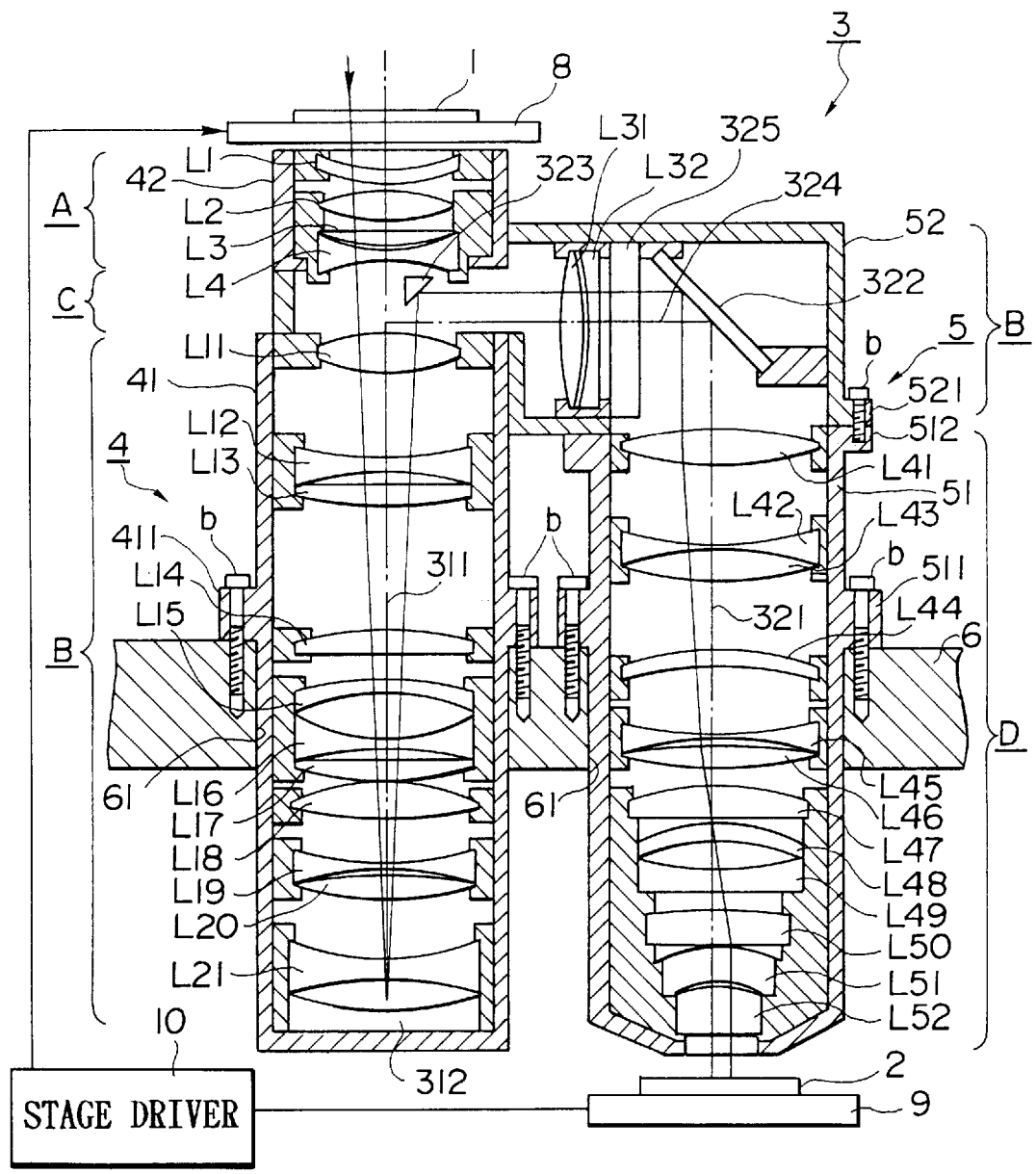
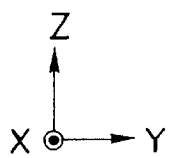

SUPPORT STRUCTURE FOR A PROJECTION EXPOSURE APPARATUS AND PROJECTION EXPOSURE APPARATUS HAVING THE SAME

This application is a continuation of PCT/JP98/05303 filed Nov. 25, 1998.

BACKGROUND OF THE INVENTION

1. Field of Invention

The present invention relates to a projection exposure apparatus which is employed in photolithographic processes to manufacture microdevices such as semiconductor elements, imaging elements, liquid crystal display elements and thin-film magnetic heads.

2. Description of Related Art

In the photolithographic process for the manufacture of semiconductor devices, a pattern on a mask is transferred on to a wafer or glass plate (hereinafter also referred to as a substrate) coated with a photo resist. This type of projection exposure apparatus, a step-and-repeat type exposure apparatus (hereinafter also referred to as a "stepper"), has been widely used in the past. This step-and-repeat type exposure apparatus reduces and projects the pattern of the mask all together on each shot region of the wafer for exposure. When it finishes exposing one shot region, it moves the wafer and exposes the next shot region. It successively repeats this operation. Further, a step-and-scan type exposure apparatus is also being developed which enlarges the exposure range of the mask pattern by limiting the exposure light from an illumination system to a slit shape (rectangular shape), using this slit light to reduce and project part of the mask pattern on to the wafer, and in that state making the projection optical system synchronously scan the mask and wafer. This step-and-scan type exposure apparatus has both the advantages of the transfer system of an aligned which transfers the pattern of the entire surface of a mask on to the entire surface of a wafer by equal magnification by a single scan and exposure operation and the advantages of the transfer system of the above stepper.

In such a conventional projection exposure apparatus, the optical elements constituting the projection optical system are held in a barrel which is fastened to a frame of the exposure apparatus. The conventional means for fastening the barrel had been to bolt a flange formed at its center to the frame. However, the two ends of the barrel were free and there was the problem that the two ends of the barrel would shake due to vibration transmitted from other apparatuses in the clean room where the projection exposure apparatus was installed, for example, fans for control of the temperature and humidity and other sources of vibration. This vibration transmitted from sources of vibration around the projection exposure apparatus was transmitted to the barrel and caused vibration there even if the frequency of the sources of vibration was small since there is a correlation between the natural vibration of the sources of vibration and the natural vibration of the barrel, so the problem of displacement of the optical axis was caused. In particular, when the projection optical system is held by a plurality of barrels like in a reflection and refraction projection system and the plurality of barrels are fastened to the frame, the relative vibration among the barrels has a large effect, so the intervals between the barrels and the relative positions in the direction of rotation change and remarkable deterioration of the imaging characteristics occurs.

Further, the resolution of an exposure apparatus is substantially proportional to the wavelength of the exposure light, so the wavelength of exposure is gradually being made shorter. The exposure light is changing from visible g-ray (wavelength 436 nm) and ultraviolet i-ray (wavelength 365 nm) by a mercury lamp to KrF excimer laser light (wavelength 248 nm). Recently, use of ArF excimer laser light (wavelength 193 nm) and F2 laser light (wavelength 157 nm) has been considered. Here, in the wavelength region lower than that of about ArF excimer laser light, that is, in the vacuum ultraviolet region below about 200 nm, absorption due to oxygen in the air occurs and ozone is produced or substances produced by a photo reaction with the organic substances or moisture in the air deposit on the surface of the optical elements, whereby the transmittance ends up falling. As a measure against this, for example, in an exposure apparatus using ArF excimer laser light, the gas inside the barrels of the projection optical system is replaced with helium (He) or another inert gas, i.e., and so-called purging is performed.

The helium used as the purging gas is highest in performance as an inert and safe gas, but is present in only extremely small amounts in the earth's mantle and atmosphere and therefore is high in price. Further, it is low in atomic weight, so it easily leaks from joints in the barrels of the projection optical system and is consumed in large amounts, therefore increasing the operating cost of the exposure apparatus.

Further, if the wavelength of the illumination light becomes shorter, the types of glass materials able to withstand actual use due to the absorption of light become more limited. If the wavelength becomes less than 300 nm, the only glass materials able to be used in practice at the present time would be fused silica and fluorite. The Abbe numbers of the two are not sufficiently far apart for correction of chromatic aberration, so correction of chromatic aberration would become difficult. As opposed to this, a catadioptric system combining a reflection optical system using a concave mirror etc. and a refraction optical system has been proposed. This catadioptric system can substantially eliminate various types of aberration such as, first and foremost, chromatic aberration, without causing an increase in the number of lenses. In a catadioptric system, however, generally it is necessary to use an optical path deflection member to separate the outbound optical path going toward the concave mirror and the return optical path from the concave mirror. As a result, several optical axes end up present. For this reason, when assembling the catadioptric system, there is the problem that error easily occurs in the adjustment among the plurality of optical axes compared with a refraction optical system.

Further, if the optical path deflection member of the catadioptric projection system tilts (rotational motion), large rotation and distortion of the image occurs. To stably obtain an image of an extremely high resolution, tough requirements are placed on the assembly position of the optical path deflection member. Further, tough requirements are placed on prevention of vibration as well so that the optical path deflection member is held in that position.

SUMMARY OF THE INVENTION

Accordingly, a first object of the present invention is to provide a projection exposure apparatus able to reduce vibration of a barrel structure of a projection optical system and thereby realize good imaging characteristics.

A second object of the present invention is to provide a projection exposure apparatus able to reduce the amount of the inert gas etc. used when supplying said gas to an optical path of the illumination light without causing deterioration of the imaging characteristics.

A third object of the present invention is to provide a projection exposure apparatus able to realize easy adjustment of a plurality of optical axes.

A fourth object of the present invention is to provide a projection exposure apparatus resistant to the occurrence of rotation of the image even when an optical path deflection member tilts and therefore stably giving an extremely high resolution.

1. To achieve the first object, according to the present invention, there is provided a projection exposure apparatus for transferring a pattern of a mask on to a substrate, said projection exposure apparatus comprising a projection optical system having an optical element, a frame for supporting a barrel structure holding the projection optical system, and a support member for supporting the barrel structure at a position different from the frame. The barrel structure may also be a plurality of barrels holding the projection optical system. In the case of a plurality, each barrel may be supported by the frame and the support member. The plurality of barrels for example may include a first barrel for holding a first optical system, a second barrel for holding a second optical system having an optical axis substantially parallel to an optical axis of the first optical system, and a third barrel for holding a third optical system arranged between the first optical system and the second optical system and having an optical axis substantially perpendicular to the optical axis of the first optical system. The support member is not particularly limited, but for example may be integrally attached to the frame.

In the present invention, the barrel structure for holding the projection optical system is supported by the frame. Simultaneously, the barrel structure is supported by the support member at a position different from the frame. Therefore, the end of the barrel structure which originally would become free is fastened. Accordingly, the occurrence of vibration at the barrel structure is suppressed and displacement of the position of the optical axis or rotation of the optical system held by the barrel structure is prevented. In particular, when the barrel structure comprises a plurality of barrels holding the projection optical system, the relative positions among the optical axes of the optical systems held by the barrels are extremely important. By using a support member to support the barrels individually or integrally, however, the vibrations of the barrels are suppressed and the intervals among the optical axes of the optical systems held by the barrels and relative positions in the direction of rotation are restrained. The barrel structure is preferably fastened to the support member through a connecting member having flexibility. The barrel structure will sometimes expand or contract due to changes in the temperature environment. In this case, if the barrel structure warps as a result of the restraint of the support member, there would sometimes be a detrimental effect on the optical characteristics, but by interposing a connecting member having flexibility, it is possible to keep an unnecessary force from acting on the barrel structure and at the same time suppress vibration.

2. To achieve the first object, according to the present invention, there is provided a projection exposure apparatus for transferring a pattern of a mask on to a substrate, said projection exposure apparatus comprising a projection optical system having a first reflection optical element for bending an optical axis, a first optical system arranged between the mask and the first reflection optical element, and a second optical system arranged between the first reflection optical element and the substrate, a frame for integrally supporting a first barrel for holding said first optical system and a second barrel for holding the second optical system; and a connecting member connecting said first barrel and said second barrel at a position different from the frame. In the present invention, the first optical system and the second optical system comprising the projection optical system are held by the first barrel and the second barrel respectively, and the first barrel and the second barrel are integrally supported by the frame, but simultaneously the first barrel and the second barrel are connected by the connecting member at positions different from the frame, so the ends of the first barrel and the second barrel which would have become free are mutually fastened. Accordingly, the vibrations of the first barrel and the second barrel will no longer affect each other and the interval between the optical axis of the first optical system held by the first barrel and the optical axis of the second optical system held by the second barrel and the relative positions in the direction of rotation are restrained.

While not particularly limited to this, preferably said second optical system has a second reflection optical element for bending said optical axis, an optical axis between said second reflection optical element and said substrate becomes substantially parallel to the optical axis of the first optical system, and the connecting member connects the first barrel and part of the second barrel between the second reflection optical element and said substrate. If the optical axis between the second reflection optical element and the substrate (hereinafter also referred to as the "image plane side optical axis") and the optical axis of the first optical system (hereinafter also referred to as the "object plane side optical axis") are made substantially parallel, the first barrel and the part of the second barrel will become substantially parallel. Since the first barrel and the part of the second barrel are connected by the connecting member in this state, in other words since barrels for which parallelism is desired to be maintained are directly connected, it is possible to better prevent relative displacement of the optical axes between the object plane side optical axis and the image plane side optical axis. Further, if the first barrel and the part of the second barrel become substantially parallel, there is also the advantage that the connecting structure by the connecting member becomes simplified.

In this case, while not particularly limited to this, the second barrel may be comprised to include two barrel components for holding an optical element arranged between said first and second reflection optical elements and an optical element arranged between said second reflection optical element and said substrate. That is, if the above-mentioned object plane side optical axis and image plane side optical axis become substantially parallel, there will be an intermediate optical path connecting these optical axes, but in this case the second barrel may be comprised by two barrel components. While not particularly limited to this, more preferably the first reflection optical element is a concave mirror arranged with the reflection surface facing upward and is supported by said frame so that its optical axis becomes substantially parallel with the direction of gravity. If a concave mirror is employed as the first reflection optical element and its optical axis is made substantially the direction of gravity, at least the optical axis of the first optical system will become substantially the direction of gravity and the first barrel will also extend in the direction of gravity. Therefore, the stability of the first barrel on the frame can be improved. Further, if the first barrel and part of the second barrel are made parallel, the part of the second barrel will also extend substantially in the direction of gravity and the stability of not only the first barrel, but also the part of the second barrel on the frame will be improved.

While not particularly limited to this, more preferably said connecting member is fastened to said first barrel and said second barrel on a pair of common tangents connecting the outer periphery of the first barrel and the outer periphery of the second barrel. If the first barrel and the second barrel are connected using the connecting member, outside force from the connecting member will act on the connected portions of the first and second barrels. If an outside force having a normal direction component is applied to a barrel, the barrel will warp, while if an outside force having a tangential direction component is applied to a barrel, that barrel will be twisted. Since the first and second barrels respectively hold the first and second optical systems, warping or twisting of the barrels will lead to warping or twisting of the optical elements, such as the lenses comprising the optical systems. That is, when connecting the first and second barrels, a connecting structure maintaining the true circularity of the barrels and preventing twisting is desirable. By fastening the connecting member to the first barrel and the second barrel on a pair of common tangents connecting the outer periphery of the first barrel and the outer periphery of the second barrel, the forces acting from the connecting member on the first and second barrels will be in tangential directions and not include normal direction components, so the true circularity of the two barrels will be well maintained and warping of the optical elements will be prevented. Further, since the member is fastened on the pair of common tangents, twisting of the first and second barrels will be prevented relatively strongly.

The specific configuration of the connecting member is not particularly limited, but it is possible to employ a connecting member which comprises a rigid plate and where at least one fastening portion among the fastening portions of the rigid plate with the first barrel and the second barrel is made movable in the normal direction. In this case, as a means for making one fastening portion movable in the normal direction, while not particularly limited to this, mention may be made of a means wherein at least one fastening portion of the rigid plate has a hinge movable in the normal direction or a means wherein at least one fastening portion of the rigid plate has a thin portion movable in the normal direction. If the connecting member is comprised by a rigid plate, twisting of the first barrel and the second barrel can be strongly prevented. Considering the manufacturing error of the connecting member and the first and second barrels, however, the fastening portions may not necessarily follow along the direction of the pair of common tangents, so force is liable to act in the normal direction of the barrels. By making a fastening portion of the rigid plate movable in the normal direction, however, even if there is manufacturing error in the rigid plate or the first and second barrels, the fastening portion of the rigid plate can absorb that error and as a result the force acting from the connecting member to the first and second barrels will become only a force in the direction of the common tangents and therefore it will be possible to prevent warping of the barrels due to a force acting in the normal direction of the barrels and in turn prevent warping of the optical elements.

As the specific configuration of the connecting member, in addition to the above rigid plate, it is possible to also employ a connecting member which is comprised of a rigid rod, wherein said rigid rod is fastened to said first barrel and second barrel on a pair of parallel common tangents connecting the outer periphery of said first barrel and the outer periphery of said second barrel, and wherein said first barrel and said second barrel are connected by a second connecting member on another common tangent connecting the outer periphery of the first barrel and the outer periphery of the second barrel. Since the connecting member is a rigid rod, it enables the weight to be reduced and is much easier to manufacture than configuration by a rigid plate. Further, by fastening it on the pair of parallel common tangents connecting the outer peripheries of the first and second barrels, the interval of the first and second barrels in the tangential direction is restrained. On the other hand, in addition, by connecting through use of a second connecting member to another common tangent connecting the outer peripheries of the first and second barrels, it is possible to restrain rotation of the first and second barrels. While not particularly limited to this, the frame and said connecting member are more preferably comprised by materials of substantially equal linear expansion coefficients. If the first and second barrels are integrally supported on the frame, when the frame expands or contracts due to the effects of the temperature, the interval between the first and second barrels at the supporting parts of the frame will change, but by comprising the frame and the connecting member by materials of substantially identical linear expansion coefficients, the connecting part of the connecting member will expand or contract equally as the expansion or contraction at the supporting part of the frame. Accordingly, it will be possible to prevent at least relative displacement of the optical axes between the optical axis of the first barrel and the optical axis of the second barrel. Further, since the frame and the connecting member will expand and contract equally, no stress at all will be applied to the barrels and it will be possible to prevent warping at the optical elements.

While not particularly limited to this, the apparatus is more preferably further provided with a first stage arranged at an object plane side of the projection optical system, a second stage arranged at an image plane side of the projection optical system, and a drive means for driving the first and second stages so as to synchronously move said mask and said substrate by a ratio of speed in accordance with the magnification of the projection optical system. By applying the present invention to a step-and-scan type projection exposure apparatus, it is possible to more effectively manifest the superior imaging characteristics of the present invention.

3. To achieve the second object, according to the present invention, there is provided a projection exposure apparatus for transferring a pattern of a mask on to a substrate, said projection exposure apparatus comprising a projection optical system having an optical element, a frame for supporting a barrel structure holding said projection optical system, a support member for supporting said barrel structure at a position different from the frame, and a partition for isolating the space including at least the outer periphery of the barrel structure from other spaces. In this case, preferably there is further comprising a gas feeder for feeding a high transmittance inert gas (for example, helium gas) to at least one of the insides of said barrel structure and the inside of said partition. Further, while not particularly limited to this, a passage connecting the inside of the barrel structure and the inside of the partition may be formed at a portion of the barrel structure covered by the partition.

According to the present invention, since a partition is provided isolating the space including at least part of the outer periphery of the barrel structure from other spaces, the air-tightness is improved. Accordingly, for example, when sealing in or feeding inert gas to the inside of the barrel structure, there will be less leakage of the inert gas to the outside of the barrel structure and the partition. Due to this, even when using the expensive helium gas as the inert gas, since the amount consumed will become smaller, the operating cost can be lowered. Further, since it is possible to deal with portions of the barrel structure which should be made air-tight altogether to some extent compared with devising measures for air-tightness for each part of said barrel structure where inert gas might leak (for example, the joints of the members comprising the barrel structure or the windows for fine adjustment of the optical characteristics), the air-tightness can be improved without making the configuration of the barrel structure that complicated and the rise in cost can be kept to a minimum. In this case, preferably at least part of the partition is a freely deformable variable partition. By this, even in the case where the partition or barrel structure etc. expands or contracts due to heat at the connecting portions of the partition and barrel structure or frame or other members (hereinafter referred to as the "barrel etc."), this will be absorbed by the variable partition and the restraining force acting on the barrel structure etc. will become smaller, so it is possible to prevent deterioration of the optical characteristics due to warping of the barrel structure etc. While not particularly limited to this, the variable partition may be made an accordion-like partition comprised of zigzag folds or may be made a sheet-like partition having flexability.

4. To achieve the third object, according to the present invention, there is provided a projection exposure apparatus for transferring a pattern of a mask on to a substrate, including a reflection and refraction projection optical system having optical members including a refraction optical member, a reflection mirror having curvature, and at least two optical path deflection members, said reflection and refraction projection optical system including at least three optical axes and at least three barrels, the at least three barrels each holding at least one optical member among the above optical members, and at least one barrel among the at least three barrels holding two optical path deflection members among the optical path deflection members so that the optical axes before and after bending by the two optical path deflection members become parallel to each other.

As explained above, in the present invention, since optical members having the same optical axes are held altogether by a barrel, each barrel has a single optical axis and therefore adjustment among the plurality of optical axes becomes easy.

5. To achieve the fourth object, according to the present invention, there is provided a projection exposure apparatus for transferring a pattern of a mask on to a substrate, including a reflection and refraction projection optical system having optical members including a refraction optical member, a reflection mirror having curvature, and at least two optical path deflecting members, any two optical path deflecting members among the at least two optical path deflecting members being held by one holding member so that their reflection surfaces become orthogonal to each other.

In this aspect of the present invention, since two optical path deflecting members are held by one holding member so that their reflection surfaces become orthogonal to each other, even if the holding member itself rotates, the relationship between the angle of incidence of the light on these two optical path deflecting members and the angle of emission of the light from the two optical path deflecting members can be maintained and therefore stability is achieved with respect to outside disturbances such as vibration of the projection exposure apparatus itself.

BRIEF DESCRIPTION OF THE DRAWINGS

FIG. 6 is a front view showing in further detail the main parts of the projection exposure apparatus of the first embodiment of the present invention, FIG. 7 is a sectional view of FIG. 6.

DETAILED DESCRIPTION OF PREFERRED EMBODIMENTS

Figure 1:
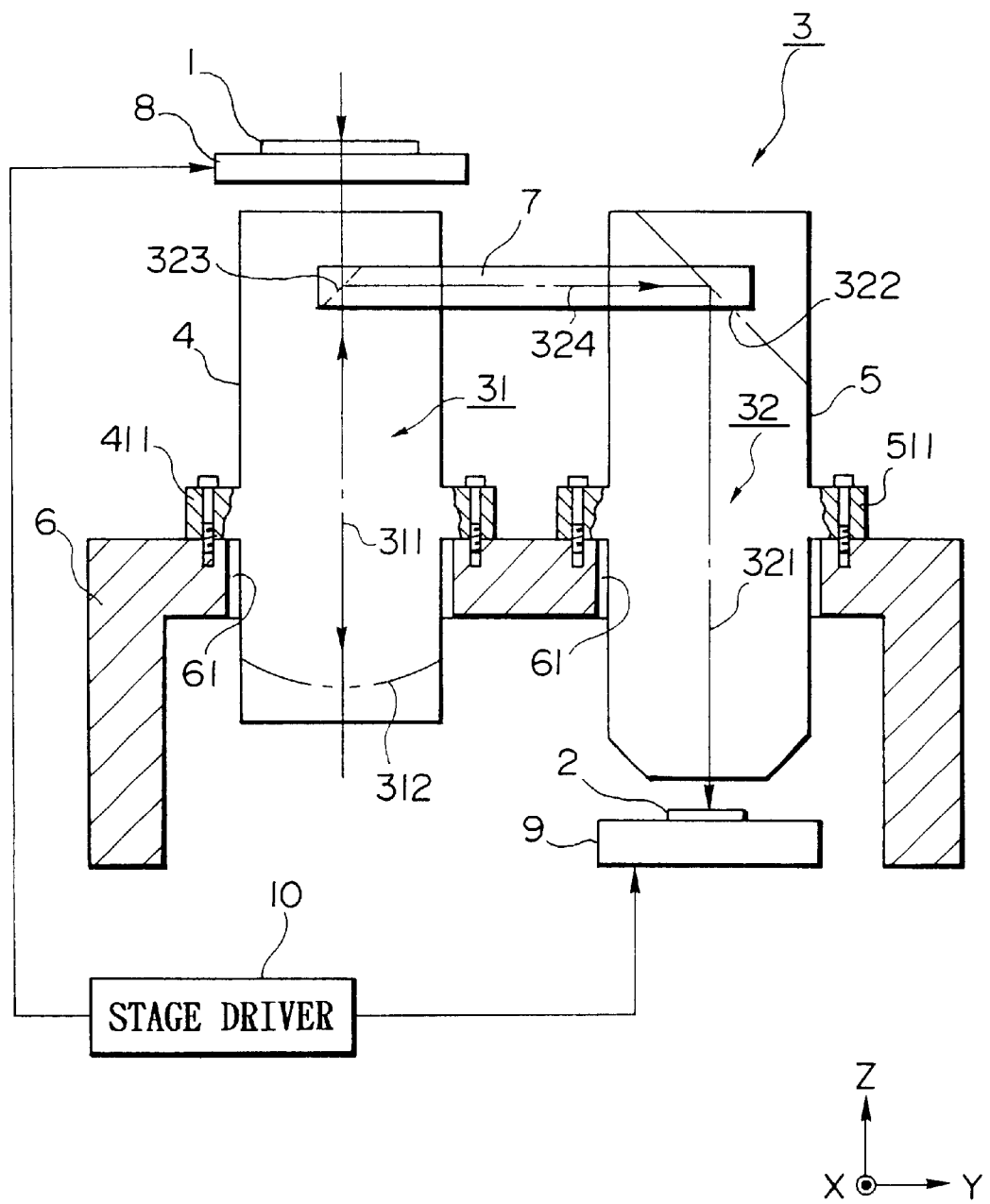
FIG. 1 is a partially cutaway front view of the configuration of main parts of a projection exposure apparatus of a first embodiment of the present invention.

An explanation will be given next with reference to the attached drawings to explain the present invention in further detail.

First Embodiment

First, an explanation will be given of the overall configuration of the first embodiment of the present invention with reference to FIGS. 1, 6, and 7. The projection exposure apparatus of this embodiment is one which transfers a pattern of a mask (or reticle) 1 on to a wafer (substrate) 2. The mask 1 is held on a mask stage (first stage) 8. While a detailed illustration is omitted, the mask stage 8 is carried via an air bearing on a guide extending in the Y-direction on a support holder, can make the support holder move in (scan) the Y-direction by use of a linear motor, and has a mechanism enabling adjustment of the position of the mask 1 in the X-direction, Y-direction, and rotational direction (θ-direction). This is done by using a moving mirror attached to the mask stage 8 side and a laser interferometer fastened to a not shown column to continuously measure the positions of the mask stage 8 in the X-direction and Y-direction at a resolution of about 0.001 μm or also measuring the rotational angle of the mask stage 8, sending these measured values to a controller of the stage drive 10, and controlling the linear motor on the table in accordance with these measured values.

On the other hand, the wafer 2 on which the mask pattern is to be transferred is held on a sample platform through a wafer holder, though a detailed illustration is omitted. The sample holder is carried on a wafer stage 9. The wafer stage 9 is carried via an air bearing on a guide on the base. Further, the wafer stage 9 is configured to be able to scan at a constant speed and step on the base in the Y-direction by use of a linear motor or step in the X-direction. Further, the wafer stage 9 has built into it a Z-stage mechanism for moving the sample platform in a predetermined range in the Z-direction and a tilt mechanism (leveling mechanism) for adjusting the angle of inclination of the sample platform. These motions are performed by using a moving mirror attached to the sample platform and a laser interferometer fastened to a not shown column to continuously measure the positions of the sample platform in the X-direction and Y-direction at a resolution of about 0.001 μm and measuring the rotational angle of the sample platform as well, sending these measured values to a controller of the stage drive 10, and controlling the linear motor for drive of the wafer stage 9 in accordance with these measured values. Note that at the time of scanning exposure, a command for the start of exposure is sent from a not shown main controller to the stage drive 10. In accordance with this, at the stage drive 10, the mask 1 is made to scan by the mask stage 8 in the Y-direction at a speed Vm and, in synchronization with this, the wafer 2 is made to scan by the wafer stage 9 in the Y-direction at a speed Vw. At this time, when the projection magnification from the mask 1 to the wafer 2 is β, the scanning speed Vw of the wafer 2 is set to β·Vm.

Further, the projection optical system 3 is supported on a U-shaped column (frame) 6 provided on the base. An oblique incidence type multipoint autofocus sensor is provided at the side surface of the projection optical system 3 in the x-direction. The autofocus sensor projects a slit image at an angle at a plurality of measurement points on the surface of the wafer 2 and sends a plurality of focus signals corresponding to the positions of these plurality of measurement points in the Z-direction (focus positions) to a not shown focus tilt controller. In this focus tilt controller, the focus position and angle of inclination of the surface of the wafer 2 are found from the plurality of focus signals obtained by the autofocus sensor and the results are sent to the stage drive 10. At the stage drive 10, the obtained focus position and angle of inclination are made to register with the focus position and angle of inclination of the imaging plane of the projection optical system 3 found in advance by driving the Z-stage mechanism and the tilt mechanism in the above wafer stage 9 by use of a servo system. Due to this, even during scanning exposure, the surface of the wafer 2 in the exposure region is automatically controlled so as to register with the imaging plane of the projection optical system 3 by use of the autofocus system and autoleveling system.

Next, an explanation will be given of the detailed configuration of the projection optical system 3 with reference to FIG. 7. The projection optical system 3 according to this embodiment is comprised of a first object portion A, an optical axis bending portion B, an optical axis deflection portion C, and a second object portion D, that is, four mechanical portions. A concave mirror (first reflection optical element) 312 is arranged at the optical axis bending portion H. The first object portion A provided directly under the mask 1 is comprised of lenses L1, L2, L3, and L4 fastened, in order from the mask 1 side, through lens cells in a barrel component 42. Further, a barrel component 41 of the optical axis bending portion B is provided under this barrel component 42 sandwiching between them a barrel component 52 of the optical axis deflection portion C. Inside the barrel component 41 are fastened, in order from the mask 1 side, lenses L11, L12 . . . , L21 and the above concave mirror 312 through lens cells. The first object portion A and the optical axis bending portion B are coaxial. The optical axis 311 is perpendicular to the pattern surface of the mask 1.

In the barrel component 52 of the optical axis deflection portion C between the barrel component 42 and barrel component 41 at a position offset in the +y-direction from the optical axis 311 is provided a small mirror 323 having a reflection surface inclined about 45° in the +y-direction with respect to the optical axis 311. Further, inside the barrel component 52 are arranged, in order from the small mirror 323 in the +Y-direction, lenses L31, L32, a correcting optical system 325, and a beam splitter (second reflection optical element) 322. Note that among these, the lenses L31 and L32 and the correcting optical system 325 may be omitted in some cases. The optical axis 324 of the optical axis deflection portion C is orthogonal to the optical axis 311. The reflection surface of the beam splitter 322 is inclined about 45° with respect to the optical axis 324 so that it is orthogonal to the reflection surface of the small mirror 323. Note that the correcting optical system 325 is comprised of a group of lenses able to be moved finely in a direction along the optical axis 324 and able to be finely adjusted in angle of inclination with respect to a plane perpendicular to the optical axis 324. The position and angle of inclination of the correcting optical system 325 are controlled by a not shown imaging characteristic corrector. The position of this correcting optical system 325 is a position substantially conjugate with the pattern surface of the mask 1 and enables correction of mainly magnification error or distortion etc.

A barrel component 51 of the second object portion D is provided to contact the barrel component 52 in a direction of the optical axis 324 bent by the beam splitter 322. Lens L41, L42 . . . , L52 are provided in it, in order from the beam splitter 322 side, via lens cells. The bottom of the lens L52 faces the surface of the wafer 2. The optical axis 321 of the second object portion D is parallel with the optical axis 311 of the first object portion A and the optical axis bending portion B and is orthogonal to the optical axis 324 of the optical axis deflection portion C. In this state, the slit-shaped illumination region on the mask 1 by means of the illumination light is set at a position offset from the optical axis 311 in the −Y-direction. Illuminating light passing through this illumination region (hereinafter also referred to as the "imaging light beam") passes through the lenses L1 to L4 of the first object portion A and through the inside of the barrel component 52 of the optical axis deflection portion C to strike the optical axis bending portion B. The imaging light beam striking the optical axis bending portion B passes through the lenses L11 to L21 to strike the concave mirror 312. The imaging light beam reflected and focused by the concave mirror 312 passes through the lenses L21 to L11 again, then is deflected by the small mirror 323 in the barrel component 52 of the optical axis deflection portion C in the +y-direction.

The imaging light beam reflected by the small mirror 323 in the optical axis deflection portion C passes through the lenses L31 and L32 and the correcting optical system 325 to strike the beam splitter 322. At this time, an image of substantially an equal magnification (intermediate image) as the pattern of the illumination region of the mask 1 is formed near the beam splitter 322 inside the barrel component 52. Therefore, the composing system comprised of the first object portion A and the optical axis bending portion B is also called an equal magnification optical system. The imaging light beam deflected in the −Z-direction by the beam splitter 322 heads toward the second object portion D. At the second object portion D, it passes through the lenses L41 to L52 whereby a reduced image of the pattern of the illumination region on the mask 1 is formed on the exposure region of the wafer 2. Therefore, the second object portion D is also called a reduction projection system. The imaging light beam which passes through the illumination region on the mask 1 in substantially the −Z-direction in this way is bent in the substantially +Z-direction by the first object portion A and the optical axis bending portion B in the projection optical system 3. This imaging light beam is further successively bent in the substantially +y-direction and −Z-direction by the optical axis deflection portion C. In the process, an intermediate image of substantially the same magnification as the pattern of the illumination region is formed, then a reduced image of the illumination region is formed at the exposure region on the wafer through the second object portion D.

The projection optical system 3 of the present embodiment is optically divided into three parts: an equal magnification optical system comprised of the first object portion A and the optical axis bending portion B, the optical axis deflecting portion C, and a reduction projection system comprised of the second object portion D. In terms of the mechanical structure, that is, the layout of the optical elements, as shown in FIG. 6 and FIG. 7, the small mirror 323 is arranged between the lens L4 of the first object portion A and the lens L11 of the optical axis bending portion H in the structure. Therefore, if trying to assemble the lens L4, small mirror 323, and lens Z11 in the same barrel, the small mirror 323 and the beam splitter 322 of the optical axis deflecting portion C would be assembled in separate barrels. If assembling the small mirror 323 and the beam splitter 322 in separate barrels in this way, however, the orthogonality of the reflection surfaces of the two optical elements 322 and 323 would be liable to change. If that orthogonality changed, it would become a cause of deterioration of the imaging characteristics. Therefore, in the present embodiment, the equal magnification optical system A and B is divided into the first object portion A and the optical axis bending portion B through the barrel component 52 of the optical axis deflecting portion C, and the small mirror 323 and beam splitter 322 are fastened inside the same barrel component 52.

When assembling such a projection optical system 3, first the first object portion A, the optical axis bending portion B, the optical axis deflecting portion C, and the second object portion D are separately assembled and adjusted. Next, the barrel component 41 and barrel component 51 are inserted into through-holes 61 of the column 6 and the flanges 411, 511 formed at the approximate centers of the barrel components 41 and 51 are temporarily fastened to the column 6 by bolts b via washers. Next, the barrel component 52 of the optical axis deflecting portion C is placed on the top ends of the barrel components 41 and 51 and the flange 512 formed at the top end of the barrel component 51 and the flange 521 formed at the bottom end of the barrel component 52 are temporarily fastened to each other by bolts b via washers. Here, the barrel component 52 is fastened to only the barrel component 51 and is not directly fastened to the barrel components 41 and 42, but is held in a noncontact state with a slight clearance. When adopting a structure in which the barrel component 52 is fastened to both of the barrel components 51 and 41, the barrel component 52 itself becomes a rigid body connecting the barrel components 41 and 51, so there is no longer a need to provide the connecting member 7 according to the present embodiment.

In this state, an adjustment use laser beam is emitted from above the lens L11 in the barrel component 41 to inside the barrel components 41, 52, and 51. The position at which the laser beam is emitted from the lens L52 at the bottom end of the barrel component 51 is monitored. Adjustment is performed so that the monitored position becomes a target position by adjusting the thickness of the washers between the flanges 411, 511, 512, and 521, by lateral movement of the barrel components 41, 51, and 52, etc. The flanges 411, 511, 512, and 521 are then fully fastened by the bolts b in the state where the position of the laser beam reaches the target position so as to fasten the optical axis bending portion B, the second object portion D, and the optical axis deflecting portion C. Finally, the barrel component 42 of the first object portion A is placed above the end of the barrel component 41 in the −Y-direction and the flange formed at the top end of the barrel 41 and the flange formed at the bottom end of the barrel component 42 (neither of which is shown) are temporarily fastened by bolts with washers interposed between them. In the same way as above, an adjustment use laser beam is emitted from above the lens L1 of the barrel component 42, the optical axis is adjusted, then the flanges are fully fastened by the bolts when the position of the laser beam reaches the target position.

Note that, explaining the correspondence between the basic configuration of the projection optical system 3 shown in FIG. 1 and the specific configuration of the projection optical system 3 shown in FIG. 7, the first optical system 31 shown in FIG. 1 corresponds to the first object portion A and the optical axis bending portion B shown in FIG. 7, the first reflection optical element 312 shown in FIG. 1 corresponds to the concave mirror 312 of the optical axis bending portion B shown in FIG. 7, the second optical system 32 shown in FIG. 1 corresponds to the optical axis deflecting portion C and second object portion D shown in FIG. 7, a first composite barrel 4 shown in FIG. 1 corresponds to the barrel components 41 and 42 shown in FIG. 7, a second composite barrel 5 shown in FIG. 1 corresponds to the barrel components 51 and 52 shown in FIG. 7, the second reflection optical element 322 shown in FIG. 1 corresponds to the beam splitter 322 shown in FIG. 7, and the optical element 323 shown in FIG. 1 corresponds to the reflection mirror 323 shown in FIG. 7.

Figure 2A:
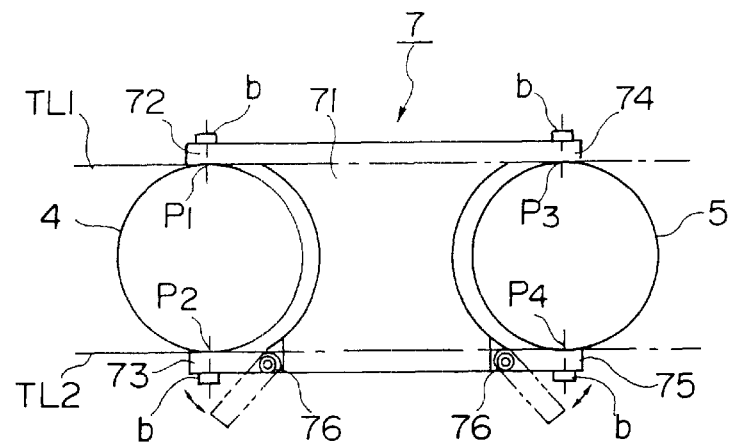
FIG. 2A is a plan view of main parts of the projection exposure apparatus of the first embodiment of the present invention.
Figure 2B:
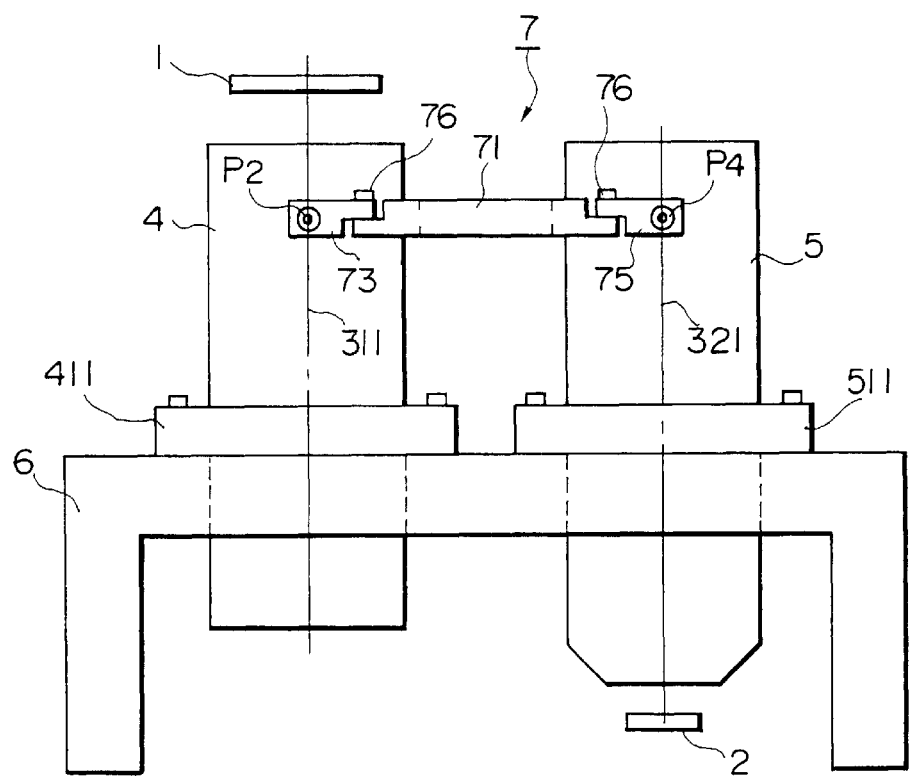
FIG. 2B is a front view of FIG. 2A.
Figure 2B:
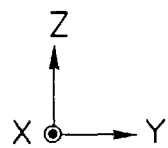

In particular, in the projection optical system 3 according to the present embodiment, the first barrel 4 and the second barrel 5 are connected by the column 6 at positions other than the support portions. That is, as shown in FIG. 2A and FIG. 2B, a connecting member 7 comprised of a rigid plate is attached to the top ends of the first barrel 4 and the second barrel 5. Note that a more detailed example of the basic configuration of the present invention shown in FIG. 2A and FIG. 2B is shown in FIG. 6. In this example, the member is attached to the top ends of the barrel components 41 and 51. The connecting member 7, as shown in FIG. 2A, is comprised of a plate-like body 71 at the two sides of which are formed four arms 72, 73, 74, and 75 corresponding to the shapes of the outer peripheries of the first and second barrels 4 and 5. Among these, the two arms 73 and 75 are provided with hinges 76 to make them pivotable. The hinges 76 may be formed by inserting pins into through-holes formed in the body 71 and the arms 73 and 75. By using these hinges 76, as shown by the arrow marks in FIG. 2A, the front ends of the arms 73 and 75 can pivot in the normal directions of the barrels 4 and 5 at one of the fastening points among the two fastening points to the barrel 4 or 5.

Further, the front ends of the four arms 72 to 75 are formed with through-holes for passage of bolts b. By fastening bolts b in the tap holes formed on the barrel 4 and 5 side, the connecting member 7 is fastened between the two barrels 4 and 5. The procedure for attaching the connecting member 7 between the two barrels 4 and 5 is first to fasten the arms 72 and 74 at the sides without the hinges 76 to the barrels 4 and 5, respectively, by use of the bolts b, then pass the bolts b through the through-holes of the arms 73 and 75 at the sides with the hinges 76. At this time, it is desirable that the outer diameters of the barrels 4 and 5 and the dimensions between the arms of the connecting member 7 corresponding to them (72 and 73, 74 and 75) be equal, but manufacturing error of the barrels 4 and 5 and the connecting member 7 sometimes results in the outer diameter of the barrels 4 and 5 becoming relatively larger or smaller.

Figure 5A:
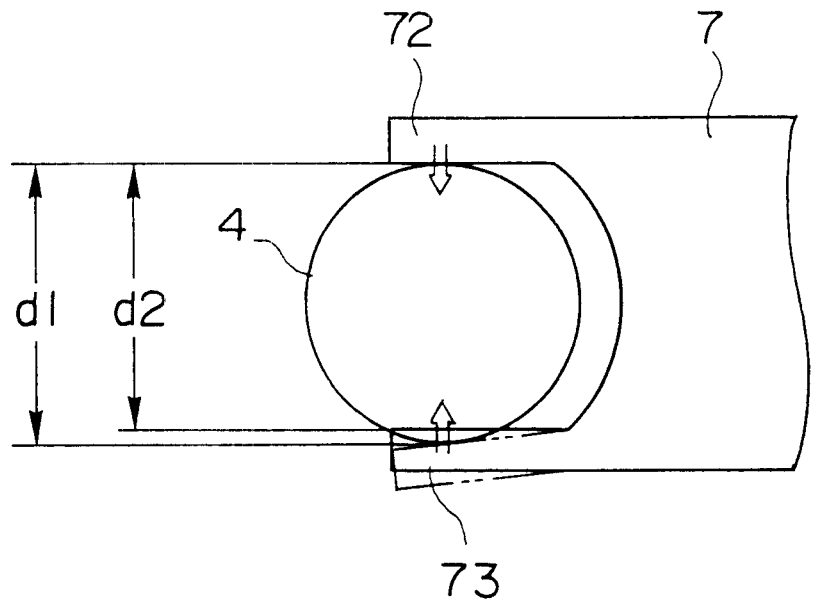
Figure 5B:
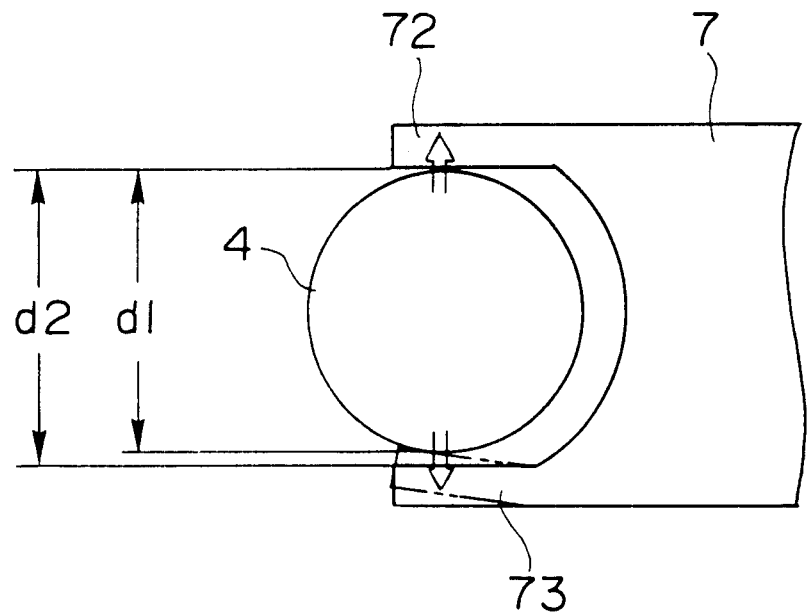

For example, when the outer diameter d1 of the barrel 4 is larger than the dimension d2 between the arms of the connecting member 7 as shown in FIG. 5A, if the member were attached to the barrel 4 using arms without hinges 76, the arms 72 and 73 would be pushed apart by the barrel 4 and a crushing force (see double arrow) would act on the barrel 4 due to the counterforce due to the rigidity of the connecting member 7. Conversely, when the outer diameter d1 of the barrel 4 is smaller than the dimension d2 between the arms of the connecting member 7 as shown in FIG. 5B, if the member were attached to the barrel 4 using arms without hinges 76, the arms 72 and 73 would be pushed together by the barrel 4 and an expanding force (see double arrow) would act on the barrel 4 due to the counterforce due to the rigidity of the connecting member 7.

In the embodiment shown in FIG. 2A and FIG. 2B, however, a hinge 76 is provided at one of the arms 73 and 75. By this, it is possible to absorb the manufacturing error of the barrels 4 and 5 and the connecting member 7. Due to this, no force acts any longer from the connecting member 7 to the barrels 4 and 5 in the normal directions, the true circularity of the barrels 4 and 5 is maintained well, and warping of the optical elements L1 to L52 is prevented. In addition to this, the fastening points P1 to P4 to the barrels 4 and 5 due to the arms 72 to 75 of the connecting member 7 according to the present embodiment are provided on a pair of common tangents connecting the outer peripheries of the two barrels 4 and 5. Explaining this with reference to the example of FIG. 2A and FIG. 2B, the tangent TL1 and tangent TL2 are the pair of common tangents. If connecting the barrels 4 and 5 in this way, the forces acting between the connecting member 7 and the two barrels 4 and 5, that is, the forces restraining the two barrels 4 and 5, all appear on the pair of common tangents TL1 and TL2 and it is possible to make them forces not including any normal direction components which would crush or expand the barrels 4 and 5.

Further, since the connecting member 7 of the embodiment shown in FIG. 2A and FIG. 2B is comprised of the rigid plate 71, it is also possible to restrain the rotation of the barrels 4 and 5. The material comprising the connecting member 7 is not particularly limited, but for example various materials such as brass, copper, stainless steel, aluminum, and other metals or various ceramics may be employed. It is however desirable to form the connecting member 7 by a material of the same nature as that of the column 6 supporting the barrels 4 and 5 or at least a material having substantially the same linear expansion coefficient. By doing this, even if the column 6 expands or contracts due to the effects of temperature and the interval between the barrels 4 and 5 changes at the support portions of the column 6 (portions of flanges 411 and 511), the fastening portions P1 to P4 with the connecting member 7 will also expand or contract by the amount of that change and therefore it will be possible to at least maintain the parallelism of the optical axis 311 and optical axis 322 and the orthogonality of these with the optical axis 324.

Figure 3A:
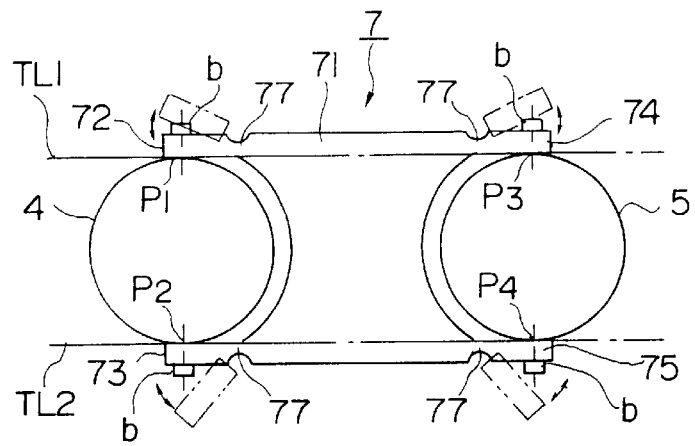
FIG. 3A is a plan view of main parts showing a modification of part of the projection exposure apparatus of the first embodiment of the present invention.
Figure 3B:
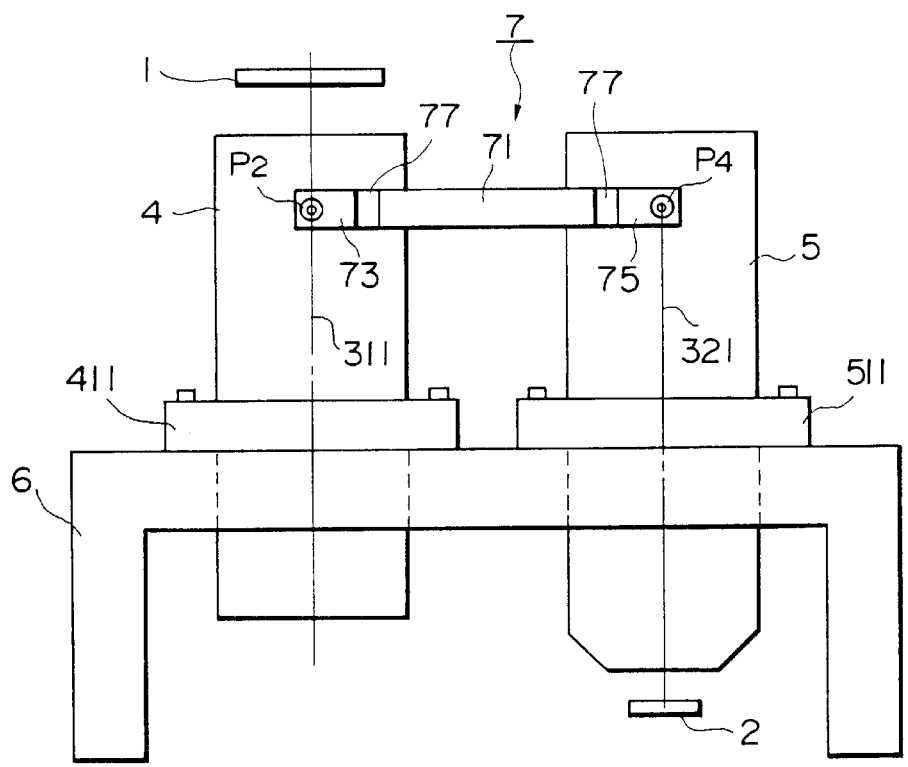
FIG. 3B is a front view of FIG. 3A.
Figure 3B:
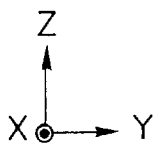
Figure 4A:
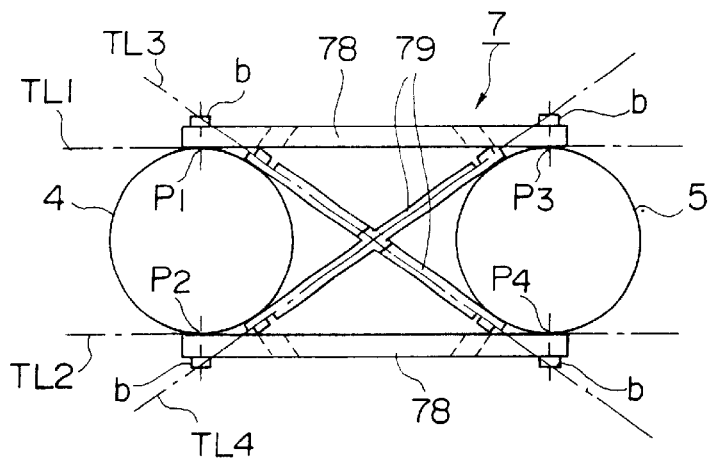
FIG. 4A is a plan view of main parts showing a further modification of part of the projection exposure apparatus of the first embodiment of the present invention.
Figure 4B:
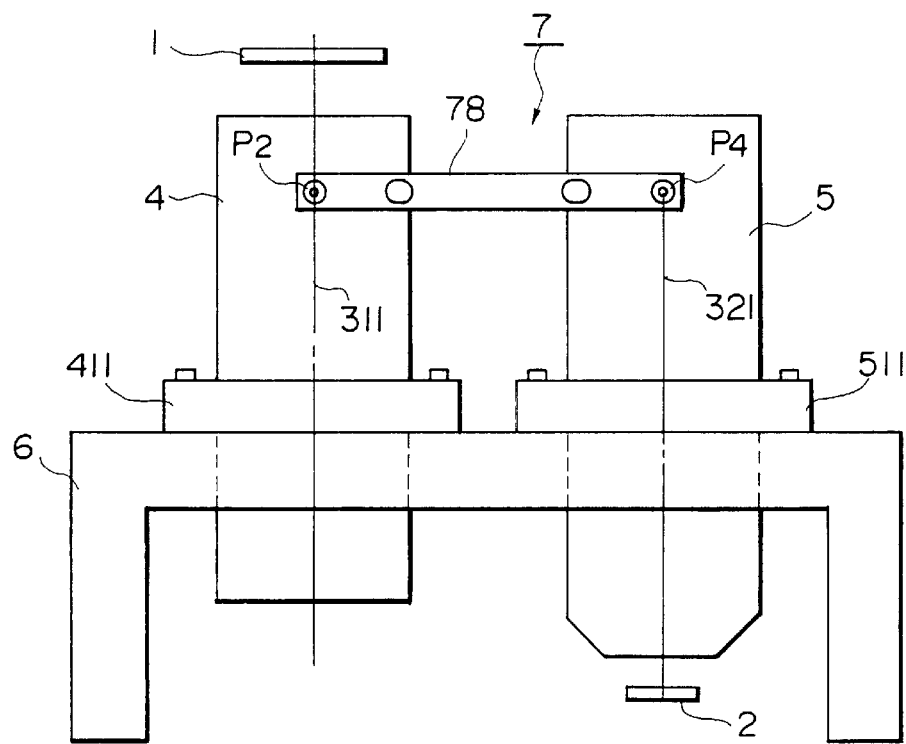
FIG. 4B is a front view of FIG. 4A, FIG. 5A and FIG. 5B are plan views of main parts for explaining the action and effect of a connecting member used in the first embodiment of the present invention.
Figure 4B:
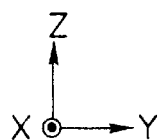

The connecting member 7 according to the present invention is not limited to those shown in FIG. 2A, FIG. 2B, and FIG. 6 and can be changed or modified in various ways. FIG. 3A and FIG. 3B show another example of the configuration of the connecting member 7 according to the present invention, while FIG. 4A and FIG. 4B show still another example of the configuration of the connecting member 7 according to the present invention. In the example shown in FIG. 3A and FIG. 3B, thin portions 77 are provided at the base ends of the arms 72 to 75 as means for enabling the arms 72 to 75 of the connecting member 7 to pivot in the normal directions of the barrels 4 and 5. These thin portions 77 have a lower rigidity than the other portions, so the arms 72 to 75 can pivot in the normal directions of the barrels 4 and 5 about the thin portions 77. The figures show thin portions 77 formed at all of the base ends of the four arms 72 to 75, but the invention is not necessarily limited to this. In the same way as the hinges 76 of FIG. 2A and FIG. 2B, it is also possible to form thin portions 77 at one of the arms (for example 73 and 75) of each of the barrels 4 and 5. The angle of pivoting of the arms 72 to 75 due to the thin portions 77 becomes smaller than that of the hinges 76 of FIG. 2A and FIG. 2B, so to absorb a larger manufacturing error, it is desirable to form the thin portions 77 at all of the arms 72 to 75 as in the example shown in FIG. 3A and FIG. 3B.

If the hinges 76 of FIG. 2A and FIG. 2B are employed, the parts of the hinge 76 portions become necessary and assembly work is also required. If thin portions 77 are used to make the arms 72 to 75 pivotable, however, no such parts or assembly work is required, so the manufacture of the connecting member 7 becomes easier. As opposed to this, in the embodiment shown in FIG. 4A and FIG. 4B, the connecting member 7 is comprised of two rigid rods 78 which are connected at the parallel common tangents TL1 and TL2 of the outer peripheries of the barrels 4 and 5. Compared with comprising the connecting member 7 by a rigid plate 71 as shown in FIG. 2A and FIG. 2B or FIG. 3A and FIG. 3B, the weight can be reduced and manufacture becomes remarkably easier.

By using two rigid bars 78 to connect the barrels 4 and 5, the interval between the optical axes at the top ends of the two barrels 4 and 5 is restrained, but twisting is not restrained, so in the example shown in FIG. 4A and FIG. 4B, a second connecting member, here the rigid rods 79, 79, are used to connect the two barrels 4 and 5. In the same way as the rigid rods 78, 78, these are designed so that no force acts in the normal directions of the barrels 4 and 5. Note that in the example shown in FIG. 4A and FIG. 4B, two rigid rods 79 and 79 are used as the second connecting member and these are attached between the two barrels 4 and 5 so as to intersect each other, but using just one of the rigid rods 79 is also possible. Due to this second connecting member 79, relative rotation, that is, twisting, of the barrels 4 and 5 can be prevented.

In the above first embodiment, the connecting member 7 was attached near the top ends of the barrels 4 and 5, but it may also be attached near the bottom ends of the barrels 4 and 5 (barrel components 41 and 51 in the embodiment shown in FIG. 6) and may be attached to both of the top ends and bottom ends. Further, in the configuration shown in FIG. 6, it may be attached between the barrel component 41 and the barrel component 52 as well. Further, only an example of arranging the projection optical system 3 in the direction of gravity was mentioned in the above embodiment, but the present invention is not limited at all in the direction of extension of the optical axis and may be applied to a system arranged in a direction other than the direction of gravity as well.

According to the first embodiment explained above, since the ends of the barrel 4 and the barrel 5 which inherently would be free are fastened to each other, the interval between the optical axis 311 of the optical system comprised by the optical elements held by the barrel 4 (first optical system) and the optical axis 321 of the optical system comprised by the optical elements held by the barrel 5 (second optical system) and the relative positions in the direction of rotation are restrained. As a result, the imaging characteristics of the mask pattern on the wafer (substrate) 2 are improved. Further, since the optical axis 311 and optical axis 312 between the second reflection optical element 322 and the wafer 2 are made substantially parallel and the first barrel 4 and barrel component 51 of the second barrel 5 are connected by the connecting member 7, the first barrel 4 and the barrel component 51 of the second barrel 5 become substantially parallel. Further, since the barrels/barrel components for which parallelism is desired to be maintained are directly connected, it is possible to more reliably prevent displacement of these optical axes. Further, since the first barrel 4 and the barrel component 51 of the second barrel 5 are substantially parallel, there is also the effect that the connection structure by the connecting member 7 is simplified. Further, since a concave mirror 312 is employed as the first reflection optical element and the optical axis 311 is made substantially the direction of gravity, the first barrel 4 extends in the direction of gravity and the stability of the first barrel on the column is enhanced. Further, since the first barrel 4 and the part of the second barrel 5 are made parallel, the barrel component 51 of the second barrel 5 also extends in substantially the direction of gravity and the stability of not only the first barrel 4, but also the barrel component 51 of the second barrel 5 on the column 6 is improved.

In addition, as shown in FIG. 4A, since the connecting member 7 is fastened to the first barrel 4 and the second barrel 5 on the pair of common tangents connecting the outer periphery of the first barrel 4 and the outer periphery of the second barrel 5, the forces acting on the first and second barrels 4 and 5 from the connecting member 7 become tangential directions not including normal direction components, so the true circularity of the two barrels 4 and 5 is maintained well and warping of the optical elements is prevented. Further, since the member is fastened on the pair of common tangents of the first and second barrels 4 and 5, the twisting of the first and second barrels 4 and 5 themselves is prevented relatively strongly. As a result, the imaging characteristics of the mask pattern on the wafer 2 are further improved. Further, if the connecting member 7 is comprised by a rigid plate and the fastening portions of the rigid plate are made movable in the normal direction, even if manufacturing error occurs in the rigid plate or the first and second barrels 4 and 5, this error can be absorbed by the fastening portions of the rigid plate, the only force acting on the first and second barrels 4 and 5 becomes one in the common tangential direction, and therefore it is possible to prevent warping of the barrels due to force acting in the normal directions of the barrels and in turn warping of the optical elements. As a result, the imaging characteristics of the mask pattern on the wafer 2 are improved more. Further, if the connecting member 7 is comprised by a rigid rod which is fastened to the pair of parallel common tangents of the first and second barrels 4 and 5 and, further, a second connecting member 79 is provided on another common tangent, it is possible to prevent warping and twisting of the barrels by use of light weight, easy-to-manufacture parts. Further, if comprising the column 6 and the connecting member 7 by materials of substantially the same linear expansion coefficient, even if the ambient temperature changes and the column 6 expands or contracts, the connecting member 7 will similarly expand or contract, so it is possible to prevent relative displacement of the optical axes of the optical axis 311 of the first barrel 4 and the optical axis 324 of the second barrel 5. Further, since the column 6 and connecting member 7 will similarly expand or contract, no stress at all will be applied to the barrels and it will be possible to prevent the occurrence of warping of the optical elements.

Second Embodiment

Figure 8A:
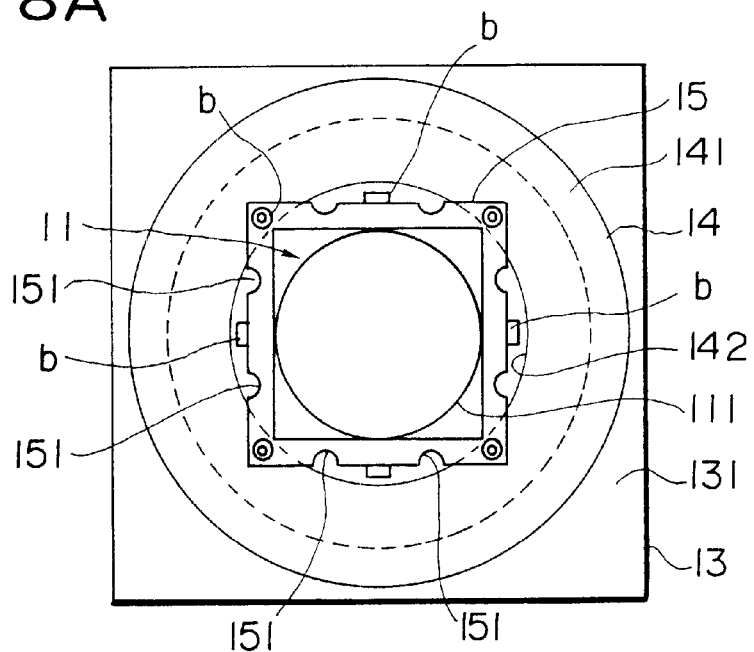
FIG. 8A is a plan view of main parts of a projection exposure apparatus of a second embodiment of the present invention.
Figure 8B:
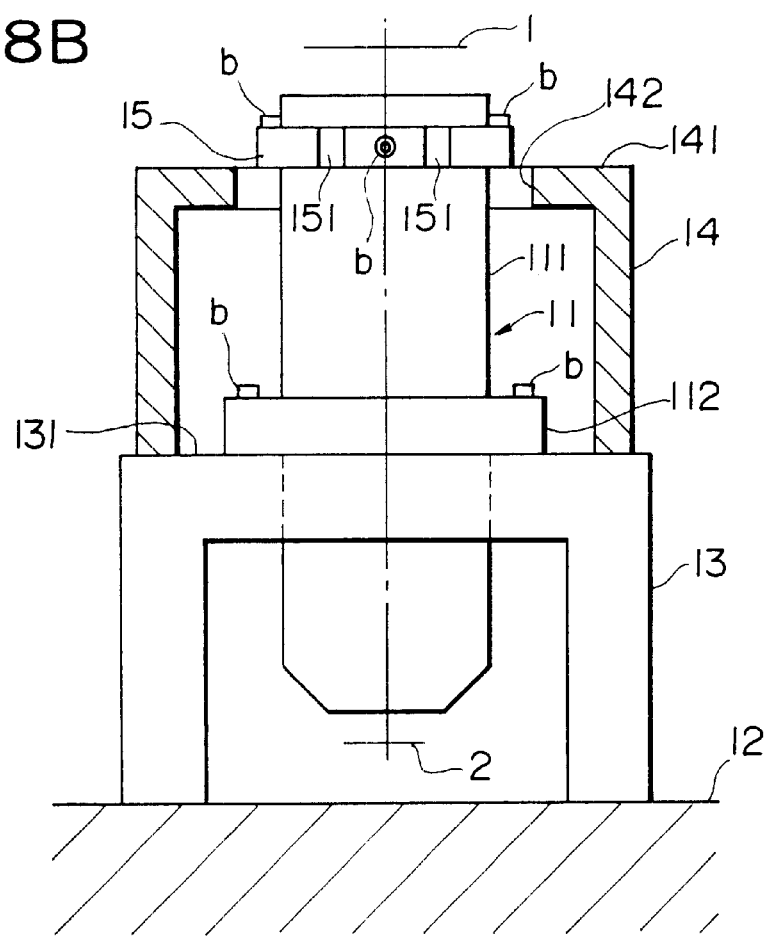
FIG. 8B is a partially cutaway front view of FIG. 8A.

A second embodiment of the present invention will be explained next with reference to FIG. 8A and FIG. 8B. The projection exposure apparatus of the second embodiment differs only in the projection optical system and its support structure and is substantially the same as the projection exposure apparatus of the first embodiment explained above in other parts of its configuration. Explanations will therefore be omitted and the explanation given focusing on the points of difference. The projection exposure apparatus of the first embodiment explained above was provided with a projection optical system (i.e. catadioptric system) comprised by an optical system combining refraction elements (lenses) and reflection elements (concave mirror, mirrors, etc.) held by a plurality of barrels and barrel components. As opposed to this, the projection exposure apparatus of the second embodiment is a projection exposure apparatus provided with a projection optical system 11 wherein all optical elements are comprised by refraction elements (lenses) and these are held by a single barrel 111.

In the figures, the projection optical system 11 comprised by an optical system having a plurality of lenses held by a single barrel 111 is supported by a U-shaped column (frame) 13 provided on a base 12 so as to be positioned at a portion between the mask 1 on which the pattern is formed and the wafer 2 to be exposed. A flange portion 112 is formed integrally at the intermediate part of the outside of the barrel 111. The barrel is inserted through a through-hole formed in the top plate 131 of the column. In that state, it is fastened by tightening bolts b at a plurality of locations at the flange portion 112. A schematically cylindrical support member 14 is integrally fastened on the top surface of the column 13. A through-hole 142 is formed at the substantial center of the top plate 141 of the support member 14. The top part of the barrel 111 fastened to the column 13 passes through this through-hole 142.

The corresponding portions of the top plate 141 of the support member 14 and the barrel 111 are joined through a connecting member 15. This connecting member 15 is comprised of an elastic body (or rigid body) having arm portions comprising four sides of a rectangle which the outer periphery of the barrel 111 inscribes and is fastened to the top plate 141 of the support member 14 by fastening bolts b at its four corners. On the other hand, the barrel 111 is inserted into the connecting member 15 so that it inscribes the inside of the connecting member 15 and in that state is fastened to the support member 14 by fastening bolts b at the inscribed portions (substantially center portions of the arms of the connecting member 15). The arm portions of the connecting member 15 are comprised of rod-like members. Thin portions 151 are formed at the two sides of the portions which the barrel 111 inscribes to impart flexibility. Due to this, the arm portions of the connecting member 15 can easily deform in the normal direction, but the member is designed so as not to deform too much in the direction along the arm portions.

According to this second embodiment, the top part of the barrel 111 (position away from fastening portions by column 13) supported by and fastened to the column 13 is fastened to the support member 15 supported by and fastened to the column 13 through the connecting member 15. Therefore, since the barrel 111 is supported and fastened at two locations away from each other in the direction of the optical axis, it is possible to prevent the optical axis from tilting due to vibration or the optical axis from rotating. In this case, in a configuration where just the flange portion 112 is supported by the column 13 by fastening the barrel 111 at two locations, warping will occur in the barrel 111 due to heat expansion or heat contraction of the barrel 111 or support member 14 when there is a temperature change in the surrounding environment and therefore twisting or tilting of the optical axis of the projection optical system 11 may occur. In the second embodiment, however, the barrel 111 is not directly fastened to the support member 14, but is fastened to the support member 14 through a connecting member 15 given flexibility in a specific direction (normal direction), so even if the barrel 111 or support member 14 etc. undergoes heat expansion or heat contraction, the connecting member 15 will deform in the normal direction with respect to the arm portions, so a change of the position of the optical axis of the barrel 111 will be suppressed, there will be less occurrence of twisting at the barrel 111, and superior optical characteristics will be maintained.

Note that in the above second embodiment, as the connecting member 15, one comprised of four arm portions arranged in a rectangle and joined together is employed, but the present invention is not limited to such a configuration. It may also be made a triangular or pentagonal or higher polylateral shape. Further, the arm portions do not have to be joined together. It is also possible to use arm members having independent arm portion shapes. In this case, it is possible to arrange the arm members so as to comprise a polylateral in the same way as above and possible to connect by means of one or two arm members. The arm portions or arm members are not limited to rod-shaped ones. It is also possible to use plate-shaped ones or in some cases curved ones. Further, when able to secure the desired flexibility by forming the connecting member 15 by means of an elastic member etc., the thin portions 151 are also not essential. In the above second embodiment, the barrel 111 is designed to be supported by the support member 14 at a portion higher than the fastening portion of the barrel 111 with the column 113, but it may be supported below the fastening portion with the column 13 as well. Further, the support member 14 may provide support at two or more locations as well. Further, the above-mentioned connecting member 15 may be used for the fastening portion of the barrel 111 with the column 13 as well. The support member 14 does not necessarily have to be fastened to the column. It may be designed to be fastened to another member, for example, the base 12, as well.

The material comprising the connecting member 15 is not particularly limited. For example, brass, copper, stainless steel, aluminum, or another metal or various ceramics and other various materials may be employed. It is desirable to form the connecting member 15 by means of the same material as the column 13 or support member 14 supporting the barrel 111 or at least by a material of substantially the same linear expansion coefficient in the same way as the case of the connecting member 7 of the above first embodiment. Further, in the above second embodiment, the explanation was given of a projection optical system having a single barrel, but even if a projection optical system having two or more barrels is provided as in the first embodiment explained above, it is possible to employ a support structure such as in the second embodiment for these barrels as well. In this case, it is possible to employ the support structure of the second embodiment (support structure by support member 14) alone or to use it together with the support structure of the above first embodiment (support structure by connecting member 7).

Figure 9A:
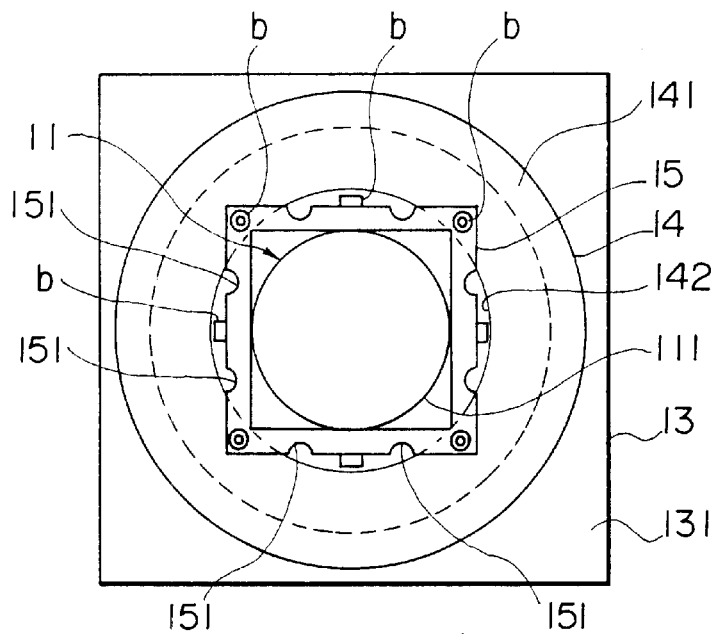
FIG. 9A is a plane view of main parts showing a modification of part of the projection exposure apparatus of the second embodiment of the present invention.
Figure 9B:
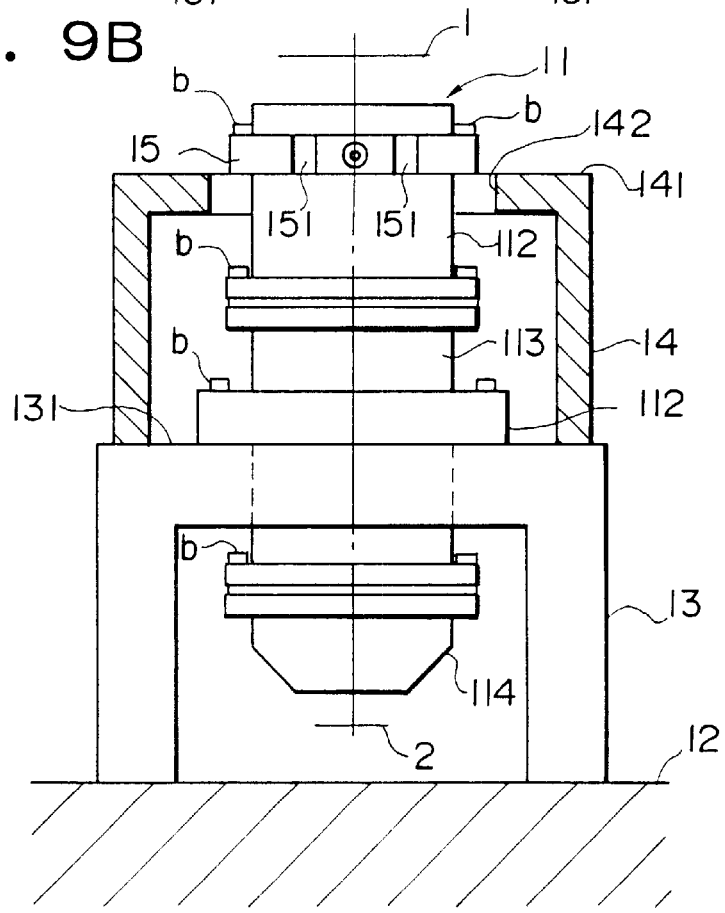
FIG. 9B is a partially cutaway front view of FIG. 9A.

Note that FIG. 9A and FIG. 9B show a projection exposure apparatus provided with a projection optical system where the single barrel of the projection optical system is divided into a plurality of barrel components 112 to 114 which are fastened integrally by fastening bolts b at the flange portions. In this case as well, it is possible to use exactly the same support structure as the support structure of the above second embodiment.

Third Embodiment

Next, an explanation will be given of a third embodiment of the present invention with reference to FIG. 10 and FIG. 11. The projection exposure apparatus of this third embodiment, compared with the above first embodiment, differs in part of the configuration of the projection optical system and differs in the point of employing a purge structure for replacing the air at part of the path of the illuminating light with an inert gas. It is substantially the same as the projection exposure apparatus of the above first embodiment in the rest of its configuration. Therefore, substantially identical components will be given the same reference numerals and explanations thereof will be omitted. In the third embodiment, a projection optical system comprised of an optical system combining refraction elements (lenses) and reflection elements (concave mirror, mirror, etc.) (catadioptic optical system) held by a plurality of barrels is employed. On this point, it is similar to the above first embodiment. It differs in the following points, however. That is, the barrels of the projection optical system of the third embodiment are comprised of three barrels of the first barrel 81, second barrel 82, and third barrel 83. Further, the first barrel 81 and the second barrel 82 are comprised of three barrel components 811 to 813 and 821 to 823, respectively.

The first barrel 81 corresponds to the first barrel 4 in the above first embodiment, the second barrel 82 corresponds to the barrel component 51 of the second barrel 5 of the above first embodiment, the third barrel 83 corresponds to another barrel component 52 of the second barrel 5 of the first embodiment, and the corresponding optical systems (optical elements) are held in the same way. The third barrel 83 in this embodiment, however, is independent from the first barrel 81 and the second barrel 82 and is directly supported by and fastened to the column (frame) 6 through an integrally provided support portion 831. The portion of the third barrel 83 for connection with the second barrel 82 is joined there through an elastic member 84 so that they do not restrain each other or so that they face each other in a state where the relative relationship is maintained. The portion of the third barrel 83 for connection with the first barrel 81 is just held in a state maintaining their relative relationship and is not directly joined there. The barrel components 811 to 813 comprising the first barrel 81 have flange portions at their joining portions and are joined together by bolting. The same applies to the barrel components 821 to 823 comprising the second barrel 82.

The first barrel 81 and the second barrel 82 in the third embodiment make use of a purge structure for replacing the air in the space between the optical elements (lenses, mirrors, etc.) with helium gas (He) or another inert gas. Further, the first barrel 81 and the second barrel 82 are provided with partitions 85 for isolating the spaces including at least parts of the outer peripheries of the barrels from other spaces. These first barrel 81 and second barrel 82 will be explained in detail with reference to FIG. 11. Note that FIG. 11 is an enlarged sectional view of the second barrel 82, but the first barrel 81 also basically has the same configuration, so the explanation will be made of the second barrel 82 and a detailed explanation of the first barrel 81 will be omitted. Further, what is shown in FIG. 11 is for explanation of the main components of the second barrel 82. The optical elements (lenses) etc. held inside are shown in a simplified manner.

The first barrel component 821, second barrel component 822, and third barrel component 823 comprising the second barrel 82 hold corresponding lens L61 to L64 etc. inside them and are joined together by bolting them at their flange portions. At part of the outer periphery of the first barrel component 821 is integrally formed a disk-shaped fixed partition 851 comprising part of the partition 85. Further, at the inside of the wall of the first barrel component 821 is formed a passage 824 for introduction of helium gas to the inside of the barrel from a gas feeder 86 comprised of a tank 861 filled with helium gas (He) under pressure and a valve 862. The second barrel component 822 has integrally a flange portion 827 for attachment to the column at the outer periphery of its center portion. On the inside of the wall of the second barrel component 822 are formed passages 825 and 826 for communicating with the space inside the barrel defined by the lenses L62 and L63. At part of the outer periphery of the third barrel component 823 is integrally formed a disk-shaped fixed partition 852 comprising part of the partition 85. At the portion between the fixed partition 851 of the first barrel component 821 and the flange portion 827 of the second barrel component 822 is attached a variable partition 853 formed in a substantially cylindrical shape so as to air-tightly seal and isolate the inside space from the outside space. Due to this, the space including the first barrel component 821 and part of the outer periphery of the second barrel component 822 is isolated from the outside space. This variable partition 853 is a partition formed in an accordion shape with zigzag folds so as to be able to freely deform in all directions including the direction along the optical axis of the optical system (L61 to L64) held by the second barrel 82. A variable partition 854 having a similar configuration as the variable partition 853 is similarly attached at the portion between the fixed partition 852 of the third barrel component 823 and the flange portion 827 of the second barrel component 822.

When exposing and transferring the pattern formed on the mask 1 to the wafer 2, the valve 862 is opened under the control of a controller etc. so as to supply helium gas from the tank 861. The helium gas is fed through passages 824, 825, and 826 formed in the wall of the second barrel 82 so that the spaces between the lenses L61 to L64 inside the second barrel 82 are filled with the helium gas. Further, it is possible to fill helium gas by making a through-hole in the lens chambers (not shown) holding the lenses L62 and L63. The helium gas fed to the inside of the second barrel 82 leaks from the joints of the barrel components 821, 822, and 823 of the second barrel 82 and the adjustment windows formed in the barrels etc., but since the partition 85 is provided outside of the second barrel 82, is sealed in the space defined by the outer periphery of the second barrel 82 and the partition 85 and thereby is prevented from leaking to the outside from the partition 85. Note that for example as shown by reference numeral 828 in FIG. 11, it is possible to deliberately form a through-hole (opening) in the wall of the barrel 82 to connect the inside space of the barrel 82 and the space defined by the outer periphery of the barrel 82 and the partition 85.

Figure 10:
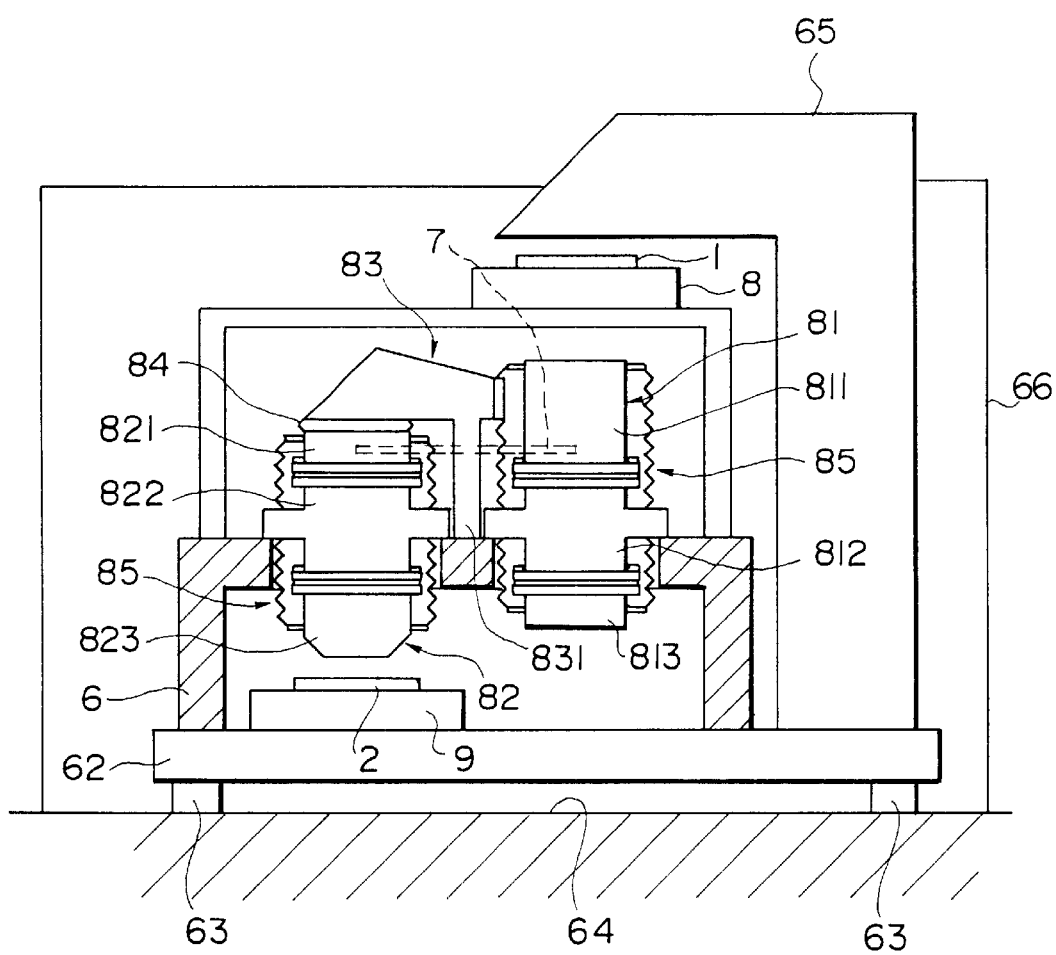
FIG. 10 is a partially cutaway front view of a projection exposure apparatus of a third embodiment of the present invention.
Figure 11:
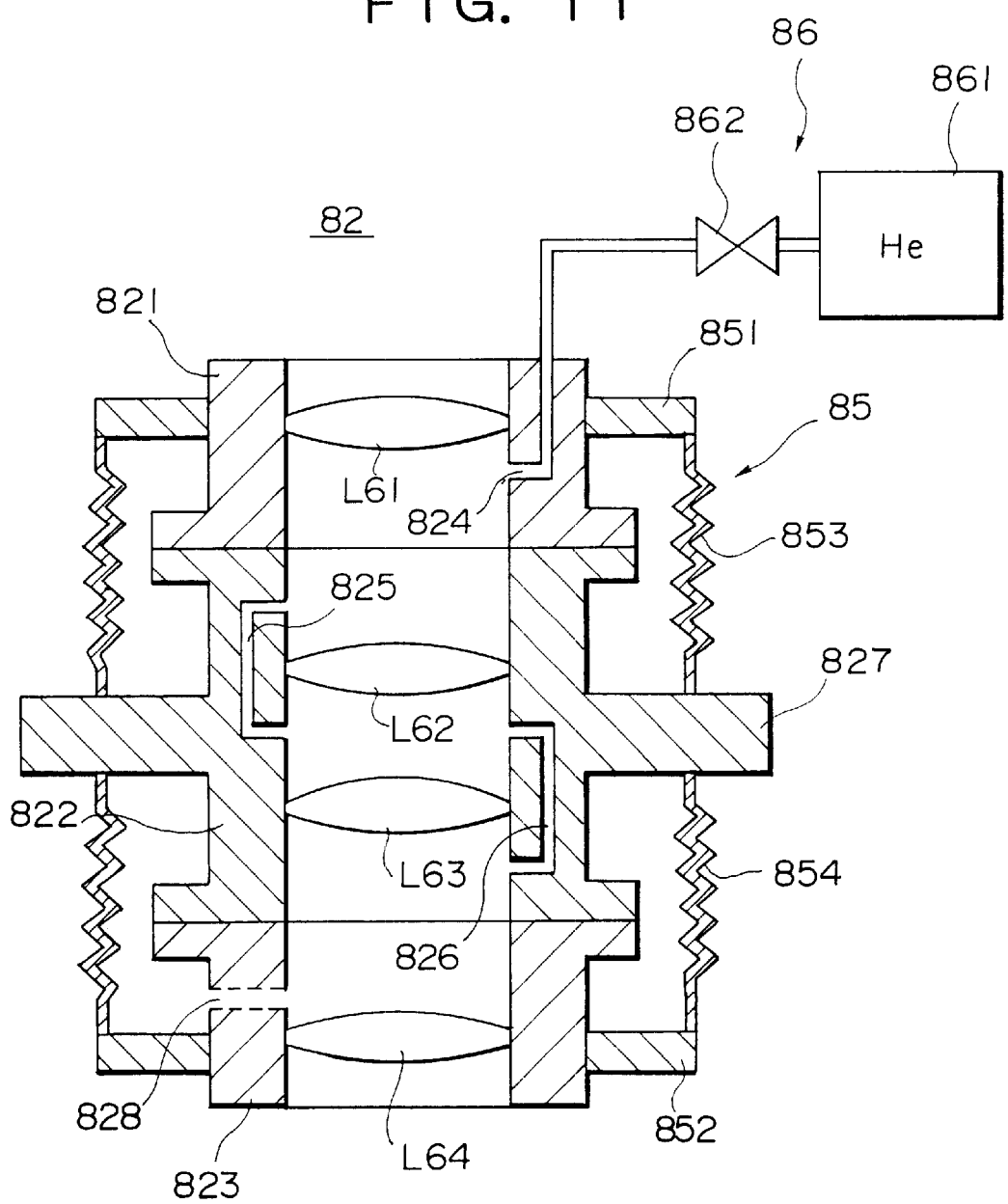
FIG. 11 is an enlarged sectional view showing the main parts of the projection exposure apparatus of the third embodiment of the present invention.

A similar purge structure is employed as with the second barrel 82 shown in FIG. 11 for the first barrel 81. Part of the variable partition 853 of the first barrel 81, however, is removed and this removed part is connected to the third barrel 83. By connecting at a portion of the variable partition 853, unnecessary force is prevented from acting on the third barrel 83. Note that in this case, it is also possible to introduce the helium gas being supplied to the first barrel 81 from the space formed by the first barrel 81 and the partition 85 to the inside of the third barrel 83. However, it is also possible to supply helium gas by use of the gas feeder independently to the third barrel 83. Note that in FIG. 10, 62 is a base on which the column 6 is placed. This base 62 is set on a floor surface 64 through a plurality of dampeners 63. Reference numeral 65 is an illumination frame holding an illumination optical system for guiding illuminating light from a not shown light source placed in a utility space etc. in the floor below the projection exposure apparatus to the top of the mask 1. Further, the projection exposure apparatus is housed in a temperature controlled chamber 66 placed on the floor surface 64. The inside of the chamber 66: is maintained at a constant environment (temperature, humidity, etc.) by means of an air-conditioning system etc. Nitrogen $N_2$ etc. is sometimes supplied inside the chamber 66. The first barrel 81 and the second barrel 82 are connected to each other by the connecting member 7 as explained already in the above first embodiment.

According to the above third embodiment, since helium gas is supplied inside the barrels 81, 82, and 83 to replace the air in the inside spaces with helium gas, there is little loss in the projection optical system even with a projection exposure apparatus employing a short wavelength laser light (for example, an ArF excimer laser, $F_2$ laser, etc.) as a light source and a good exposure performance can be realized. Further, the helium gas supplied inside the barrels 81 and 82, even if leaking to the outside of the barrels, is prevented from leaking to the outside by the partitions 85 provided at the outsides of the barrels 81 and 82, therefore it is possible to reduce the amount of expensive helium gas consumed and reduce the operating cost. Further, since parts of the partitions 85 are formed by variable partitions able to freely deform in the direction including the direction of the optical axis, there is little unnecessary force acting on the barrels 81 and 82 due to the partitions 85 and little detrimental effect on the positional relationship of the optical elements L61 to L64 held in the inside and good optical characteristics can be realized.

Note that in the above third embodiment, while parts of the partitions 85 were made by accordion-like variable partitions 853 and 854 so as to reduce the action of unnecessary force on the barrels 81 and 82 due to attachment of the partitions 85, the present invention is not limited to these variable partitions 853 and 854, and may also be sheet-like partitions having flexibility and other partitions. Further, as the location supplied with the helium gas by means of the gas feeder 86, it is also possible to supply the gas to the space between the outer peripheries of the barrels 81 and 82 and the partitions 85, from through-holes in the walls of the barrels 81 and 82, and introduce helium gas inside the barrels 81 and 82 through these through-holes. The gas which is supplied by the gas feeder is not limited to helium gas and may also be nitrogen gas etc.

Further, as shown in FIG. 10, to reduce the height of the projection exposure apparatus as a whole or reduce the internal volume of the chamber 66, there are cases where part of the illumination frame 65 is arranged to stick out from the ceiling of the chamber 66 and the chamber 66 and illumination frame 65 are joined. It is desirable to interpose a cushion member having elasticity or flexibility at this joint to prevent the two from restraining each other. As this cushion material, a member the same as the above variable partitions 853 and 854 may be employed.

Note that in this embodiment, it is also possible to attach a cover having air-tightness (partition in the embodiment etc.) for each portion of the barrels where the inert gas may leak (for example, joints of members comprising the barrels, adjustment windows for fine adjustment of optical characteristics, etc.)

Fourth Embodiment

Figure 12:
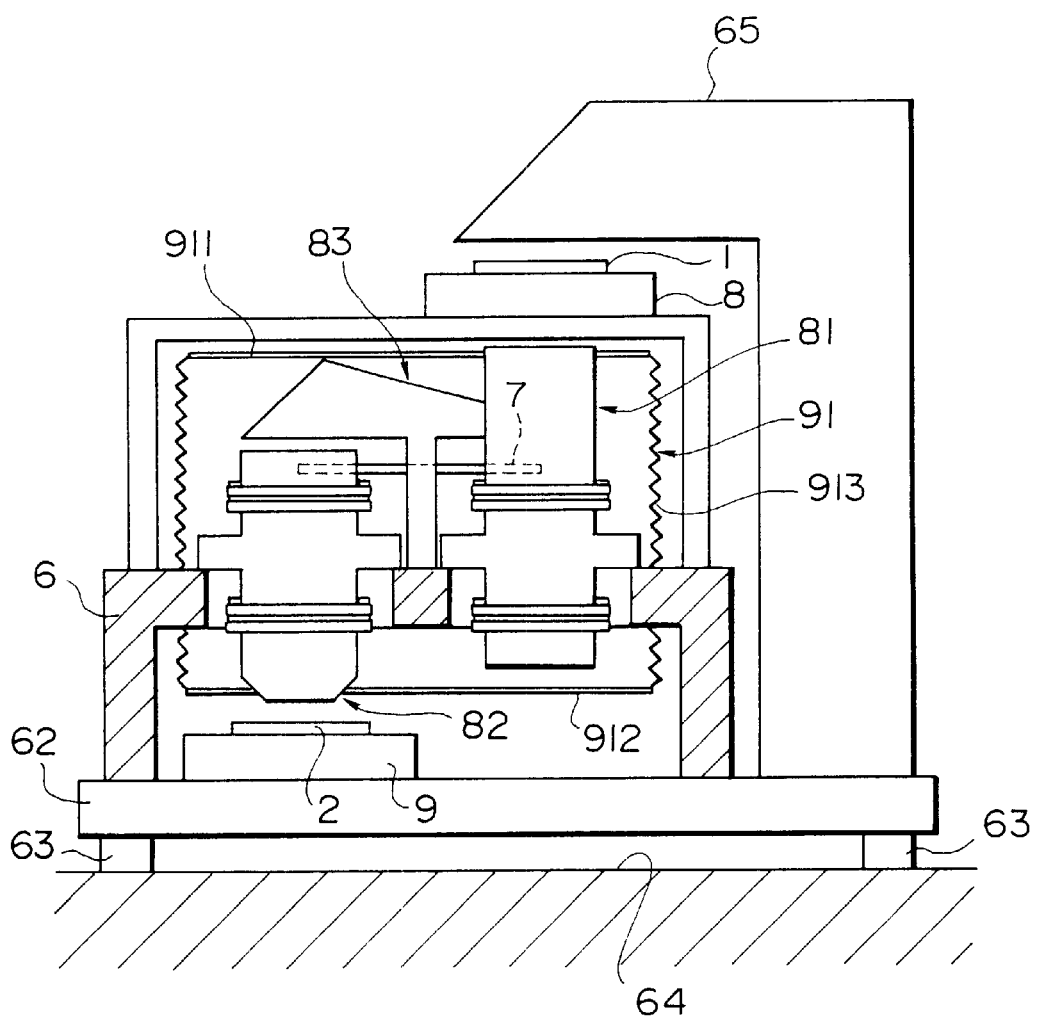
FIG. 12 is a partially cutaway front view of a projection exposure apparatus of a fourth embodiment of the present invention.

Next, an explanation will be given of a fourth embodiment of the present invention with reference to FIG. 12. Components substantially identical to those of the third embodiment explained above are given the same reference numerals and explanations thereof omitted. The explanation will be made of the different portions. In the above third embodiment, helium gas was prevented from leaking by the partitions 85 at the barrels 81 and 82, but in the fourth embodiment the entire projection optical system rather than individual barrels is sealed by the partition 91. In the figure, a relatively large size fixed partition 911 is integrally attached to the top part of the first barrel 81. A similar fixed partition 912 is attached to the second barrel 82. Further, variable partitions 913 and 914 having similar configurations to the variable partitions 853 and 854 of the above third embodiment are attached between the fixed partition 911 and column 6 and between the fixed partition 912 and column 6. Helium gas may be supplied from the gas feeder 86 individually to the barrels 81 and 82, but may also be supplied to the inside of the partition 91 as a whole. It is possible to form an effective air-tight space without causing any unnecessary force to act on the barrels 81 and 82 by the variable partition 913.

Fifth Embodiment

Figure 13:
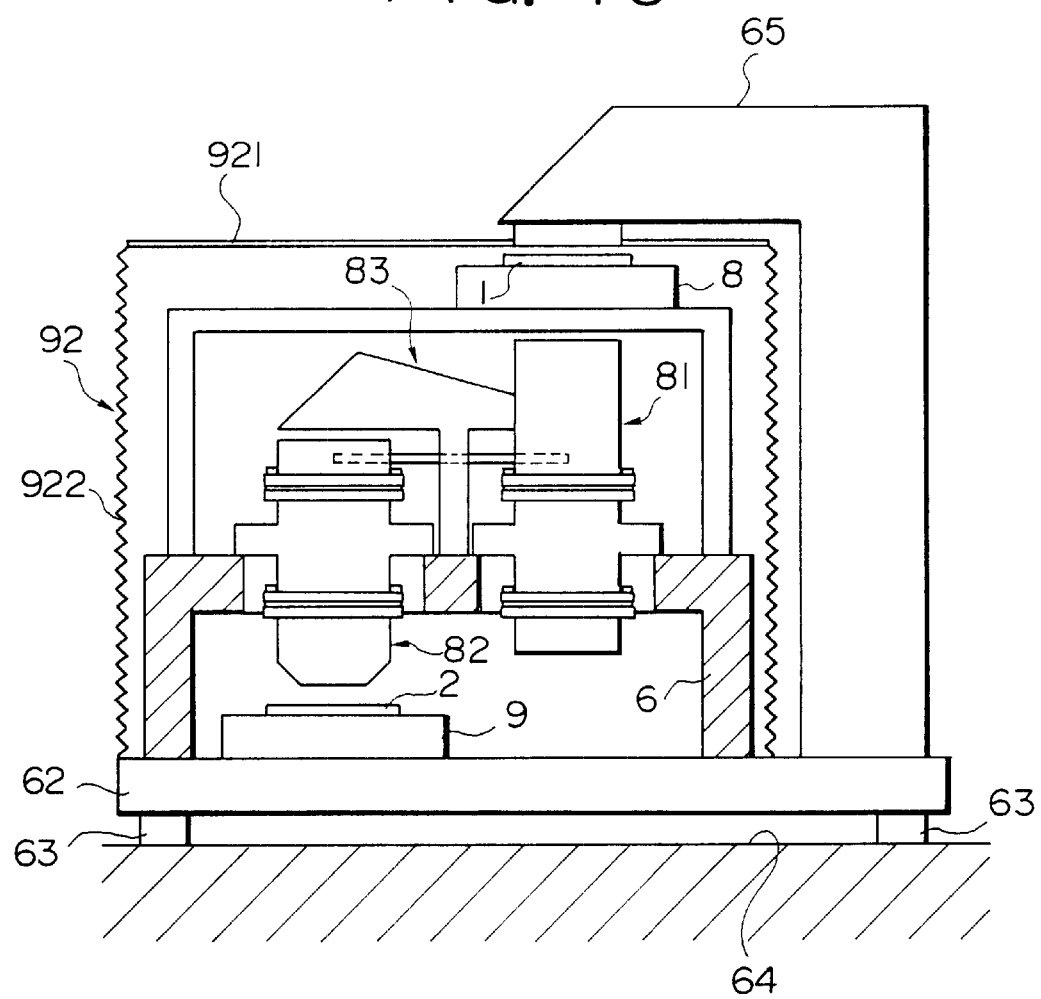
FIG. 13 is a partially cutaway front view of a projection exposure apparatus of a fifth embodiment of the present invention.

Next, an explanation will be given of a fifth embodiment of the present invention with reference to FIG. 13. Components substantially identical to those of the third embodiment explained above are given the same reference numerals and explanations thereof omitted. The explanation will be made of the different portions. In the above third embodiment, helium gas was prevented from leaking by the partitions 85 at the barrels 81 and 82, but as shown in FIG. 13, rather than each barrel, the projection optical system and the mask stage 8 and wafer stage 9 as a whole are sealed by the partition 92. In the figure, a substantially horizontal, relatively large size fixed partition 921 is integrally attached near the part of the illumination frame 65 emitting the illuminating light. A variable partition 922 having a similar configuration to the variable partitions 853 and 854 of the above third embodiment is attached between the fixed partition 921 and the base 62. Helium gas may be supplied from the gas feeder 86 individually to the barrels 81 and 82, but may also be supplied to the inside of the partition 92 as a whole. It is possible to form an effective air-tight space without causing any unnecessary force to act on the illumination frame 65 by the variable partition 922.

Sixth Embodiment

Figure 14:
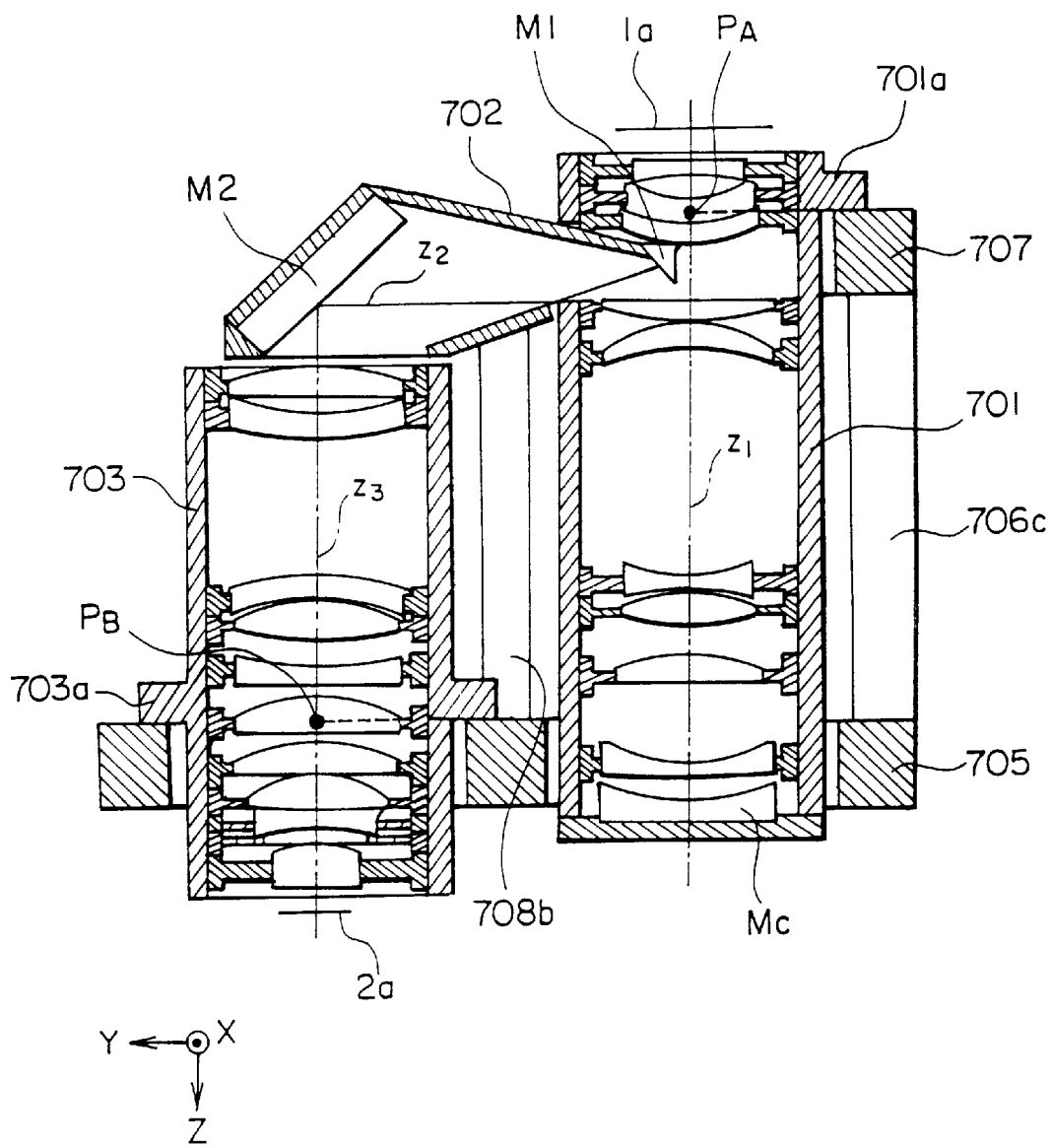
FIG. 14 is a sectional view of an optical projection system of a projection exposure apparatus of a sixth embodiment of the present invention.

Next, an explanation will be given of a sixth embodiment of the present invention with reference to FIG. 14 to FIG. 16. FIG. 14 is a sectional view of a projection optical system used for a reflection and refraction projection exposure apparatus according to an embodiment of the present invention. The projection optical system forms an intermediate image on the object plane 1$a$ (mask plane) by a first imaging optical system housed in a first barrel 701 and causes reimaging of the image (secondary image) of the intermediate image on the image plane 2 (wafer plane) by a second imaging optical system housed in a third barrel 703. The optical axis (first optical axis z1) of the first imaging optical system is arranged in the perpendicular Z-direction. Further, the first imaging optical system is comprised of a first group and a second group of members including a concave mirror MC. At this time, the light from the object plane 1$a$ passes through the first group, then strikes the second group, is reflected by the concave mirror MC, and is emitted from the second group. In this way, the second group forms a two-way optical system.

The intermediate image on the object plane formed by the first imaging optical system is formed between the first group and the second group of members. A first flat mirror M1 is arranged near the position of the intermediate image. Due to the flat mirror M1, the first optical axis z1 of the first imaging optical system is bent 90° and becomes a second optical axis z2 extending in the left-right Y-direction. A second flat mirror M2 is arranged in the second optical axis z2. Due to the flat mirror M2, the second optical axis z2 is further bent 90° to become a third optical axis z3 extending in the perpendicular Z-direction. These two flat mirrors M1 and M2 are held by the second barrel 702 so that they are orthogonal to each other and both form angles of 45° with respect to the second optical axis z2. The second imaging optical system is arranged in the third optical axis z3. An aperture is arranged inside the second imaging optical system.

This projection optical system has the second group of the first imaging optical system serving as a two-way optical system, so the position of the optical axis z1 on the object plane 1$a$ and the position of the optical axis z3 on the image plane 2a must not be regions of use. That is, the illumination region of the illumination optical system (not shown) illuminating the reticle pattern forms a long slit shape in the front-back X-direction away from the first optical axis z1. As a result, the exposure region of the projection optical system also forms a long slit shape in the front-back X-direction away from the third optical axis z3. Further, by simultaneously scanning the reticle R and the wafer W in the left-right Y-direction, the entire region of the reticle pattern can be transferred to the exposure plane of the wafer.

Figure 15A:
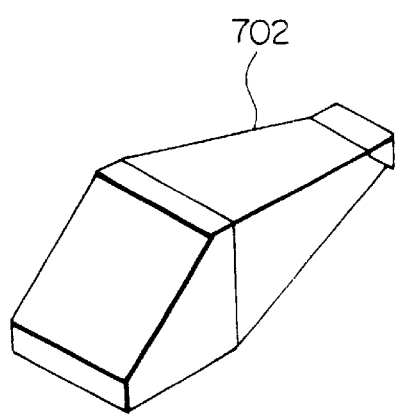
FIG. 15A to FIG. 15C are perspective views of the barrels of the FIG. 14.
Figure 15B:
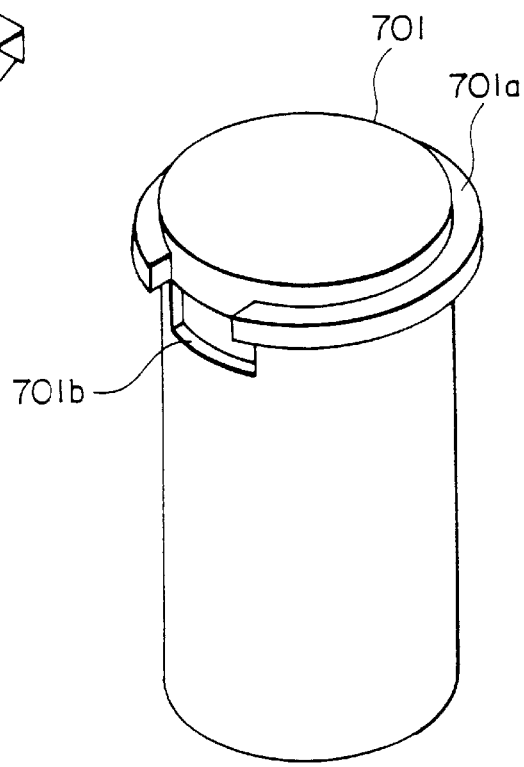
Figure 15C:
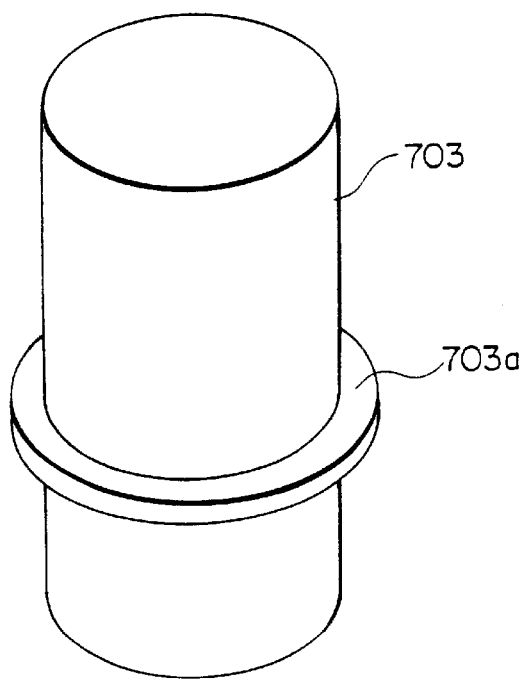
Figure 15C:
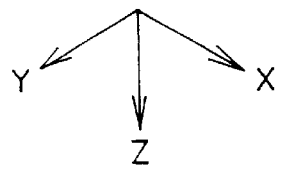

Next, an explanation will be given of the support structure of the projection optical system. FIG. 15A, FIG. 15B, and FIG. 15C are perspective views of barrels. The first barrel 701 holding the first imaging optical system and the third barrel 703 holding the second imaging optical system are formed as substantially cylindrical shapes. The second barrel 702 holding the flat mirrors M1 and M2 is formed as a substantially angular conical shape. Note that the first barrel 701 is provided with an opening 701b. When assembling the projection optical system, part of the second barrel 702 fits in the opening 701b.

Figure 16:
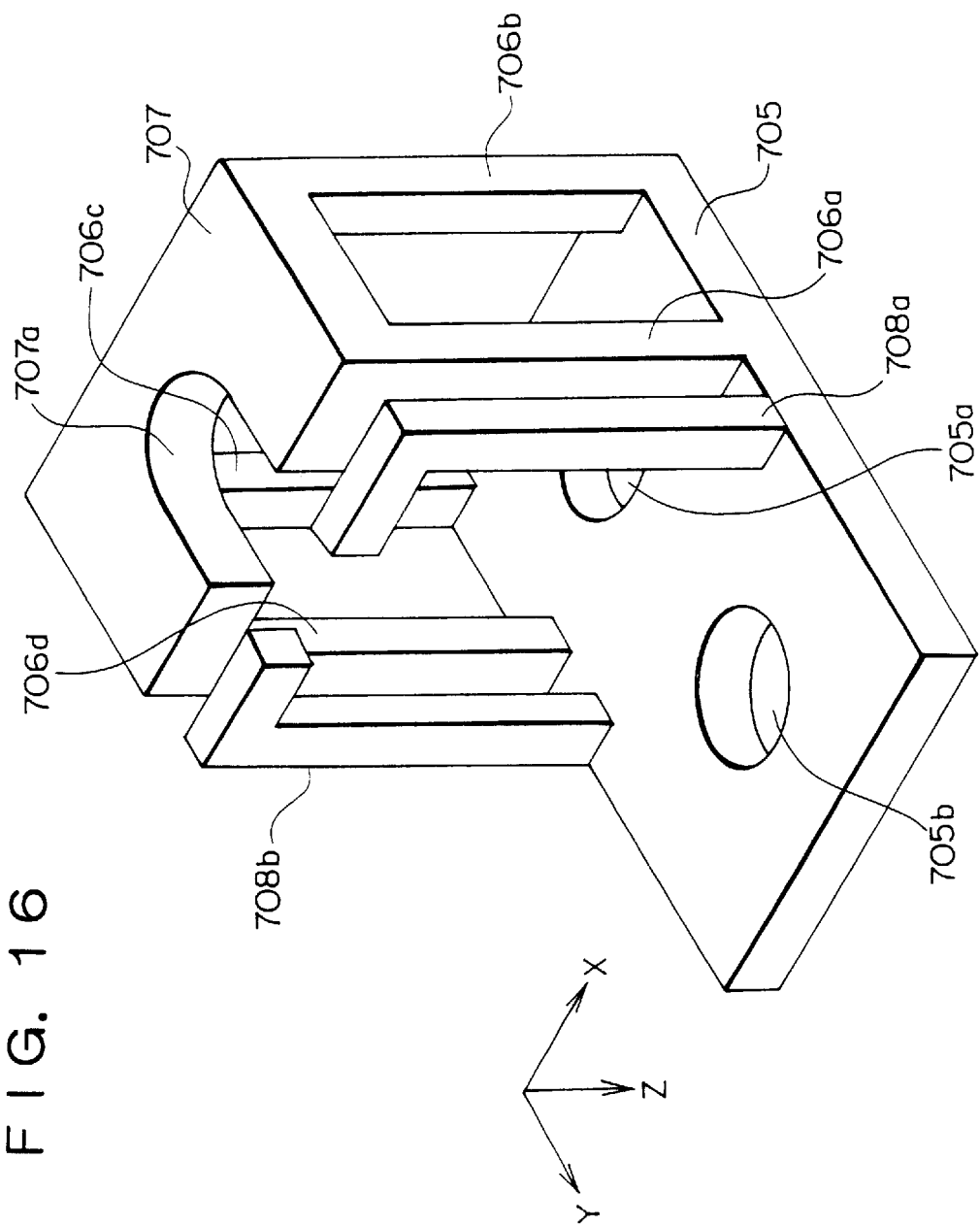
FIG. 16 is a perspective view of a frame of the projection exposure apparatus of the sixth embodiment of the present invention.

FIG. 16 is a perspective view of the frame structure supporting the barrels. In FIG. 16, a lower frame 705 formed as a flat plate is provided with openings 705a and 705b for passage of the first barrel 701 and third barrel 703. Four main support columns 706a to 706d are formed standing on this around the opening 705a for the first barrel among these openings. An upper frame 707 is fastened on the top surfaces of the main support columns 706a to 706d. The upper frame 707 is provided with a U-shaped opening 707a for supporting the first barrel 701.

The first barrel 701 is provided at its top portion with a flange, 701a flaring out to its sides. The bottom surface of the flange 701 is placed on the top surface of the upper frame 708 around the U-shaped opening 707a whereby the first barrel 701 is supported. Similarly, the third barrel 703 is provided at its bottom part with a flange 703a flaring out to its sides. The bottom surface of the flange 703a is placed on the top surface of the lower frame 705 around the opening 705b for the third barrel, whereby the third barrel 703 is supported. On the other hand, between the opening 705a for the first barrel and the opening 705b for the third barrel of the lower frame 705 are attached a pair of auxiliary support columns 708a and 708b formed as inverted L-shapes. The second barrel 702 is supported by these auxiliary support columns 708a and 708b.

In the above way, the frame of the exposure apparatus of this embodiment is comprised of the lower frame 705, main support columns 706a to 706d, upper frame 707, and auxiliary support columns 708a and 708b. The barrels 701, 702, and 703 are supported by the frame independently of each other. Note that the first and third barrels 701 and 703 are preferably supported at the points PA and PB obtained by interior division of the object-image distance of the optical system formed by the optical members housed in the barrels by a ratio of 1:(−β) (exterior division points when β is positive). At this time, even if the barrels 701 and 703 rotate about these points, there is the effect that the position of the image point will not shift.

Next, an explanation will be given of the effects of this embodiment. The freedom of the positions which the 3-dimensional object can take is comprised of a total of six freedoms of the positions in the X-, Y-, and Z-directions and the angular positions around the X-, Y-, and Z-axes. The first barrel 701 and the third barrel 703 are both supported separately by the frame at the bottom surfaces of the flanges 701a and 703a, so parallel movement in the vertical Z-direction, parallel movement in the horizontal X- and Y-directions, and rotation about the perpendicular axis Z all are difficult to occur. In particular, the perpendicular axis Z is the direction of the optical axes z1 and z3. Both the first imaging optical system and the second imaging optical system are formed symmetrically about the optical axes z1 and z3, so even if rotation about the perpendicular axis Z occurs, no aberration will be produced at all.

Next, the second barrel 702 is resistant to parallel movement in the perpendicular Z-direction and parallel movement in the horizontal X- and Y-directions, but is susceptible to rotation about the X-, Y-, and Z-axes. If any of these occurs, displacement of the image will occur. The second barrel 702, however, is directly held from the frame, so even if the first barrel 701 or the third barrel 703 vibrate, the vibration will not be transmitted to cause vibration of the second barrel 702. Therefore, if the stability of the frame is made high, it is possible to sufficiently prevent vibration of the second barrel 702.

Further, the configuration of the present embodiment is also effective when assembling the projection optical system. As shown in FIG. 14, to assemble the projection optical system, first the barrels 701 to 703 are assembled. At that time, the barrels 701 to 703 are easy to assemble since there are only single optical axes. Among these, in the first barrel 701 and the third barrel 703, the optical members need only be successively stacked in order from the bottom up so that there is no displacement in the optical axes z1 and z3. Further, for the second barrel 702, it is sufficient to assemble the two flat mirrors M1 and M2 so that they are orthogonal to each other.

Next, to assemble the projection optical system as a whole, first the first barrel 701 and the third barrel 70 are fit into the frame shown in FIG. 16. At that time, it is sometimes difficult to make the positional relationship of the two barrels 701 and 703 completely match the design data. Deviation in the positional relationship between the first barrel 701 and the third barrel 703 may include deviation in height in the perpendicular Z-direction and deviation in the distance between optical axes in the horizontal Y-direction. Among these, if there is deviation in height in the perpendicular Z-direction between the first barrel 701 and the third barrel 703, the total length from the reticle to the wafer on the optical axis will off from the design data. In this case, when fitting the second barrel 702 into the auxiliary support columns 708a and 708b, it is possible to obtain the total length of the design value by adjusting the height of attachment of the second barrel 702.

Further, when there is a deviation in the distance between optical axes of the first barrel 701 and third barrel 703, it is possible to absorb the deviation in the distance between optical axes by adjusting the position of attachment of the second barrel 702 in the horizontal Y-direction. By doing this to adjust the positions among the barrels, it is possible to easily assemble the projection optical system to the design data.

Note that in the embodiment shown in FIG. 14 to FIG. 16, a plurality of optical members arranged along the first optical axis z1 were held in a single barrel 701 and a plurality of optical members arranged along the third optical axis z3 were held in the single barrel 703. Here, it is also possible to adopt a configuration splitting one or more of the first barrel 701 and third barrel 703, that is, comprising at least one of the first barrel 701 and the third barrel 703 by a plurality of barrel components.

Further, in the above embodiment, the second barrel 702 integrally held two reflection surfaces M1 and M2 orthogonal with each other. Therefore, even if the second barrel 702 vibrated, the two reflection surfaces M1 and M2 would rotate integrally near their support points. The angle of the light incident on the optical system comprised by the two reflection surfaces M1 and M2 and the angle of the light emitted from the optical system are maintained so long as the two reflection surfaces M1 and M2 rotate integrally, so there is the effect that rotation or displacement of the image will be difficult to occur. Note that this effect is remarkable when there is no refraction optical member at all between the two reflection surfaces M1 and M2.

Further, in the above embodiment, as the illuminating light for exposure, it is possible to use ultraviolet light of a wavelength of 100 nm or more, for example, a g-ray, i-ray, and KrF excimer laser or other distant ultraviolet (DUV) light, ArF excimer laser, and $F_2$ laser (wavelength 157 nm) or other vacuum ultraviolet (VUV) light. In a scanning type exposure apparatus using an $F_2$ laser as the light source, a reflection and refraction optical system is employed as the projection optical system as in the above embodiment, the refraction optical members (lens elements) used for the illumination optical system or the projection optical system all become fluorite, the air in the $F_2$ laser light source, illumination optical system, and projection optical system is replaced by helium gas, and helium gas is filled between the illumination optical system and projection optical system and between the projection optical system and the wafer. Further, in an exposure apparatus using an $F_2$ laser, a reticle made of one of fluorite, fluorine-doped synthetic quartz, magnesium fluoride, crystallized quartz, etc. is used. Note that as the refraction optical members used in the projection optical system, it is possible to use one or more types of materials from not only fluorite, but also fluorine-doped synthetic quartz, magnesium fluoride, and crystallized quartz.

Note that instead of an excimer laser, it is also possible to use a high harmonic of a solid laser such as a YAG laser having an oscillation spectrum at any of for example a wavelength of 248 nm, 193 nm, or 157 nm.

Further, it is possible to amplify an infrared region or visible region single wavelength laser light emitted from a DFB semiconductor laser or fiber laser by for example an erbium (or both erbium and yttrium) doped fiber amplifier and use the high harmonic obtained by converting the wavelength to ultraviolet light using a nonlinear optical crystal.

For example, if the oscillation wavelength of the single wavelength laser is made a range of 1.51 $\mu$m to 1.59 $\mu$m, an 8th harmonic of an oscillation wavelength in the range of 189 to 199 nm or a 10th harmonic of an oscillation wavelength in the range of 151 to 159 $\mu$m is output. In particular, if the oscillation wavelength is made one in the range of 1.544 to 1.553 gym, ultraviolet light of an 8th harmonic in the range of 193 to 194 nm, that is, a wavelength substantially the same as that of an ArF excimer laser, is obtained. If the oscillation wavelength is made one in the range of 1.57 to 1.58 gym, ultraviolet light of a 10th harmonic in the range of 157 to 158 nm, that is, a wavelength substantially the same as that of an $F_2$ laser, is obtained.

Further, if the oscillation wavelength is made one in the range of 1.03 to 1.12 $\mu$m, a 7th harmonic of an oscillation wavelength in the range of 147 to 160 $\mu$m is obtained. In particular, if the oscillation wavelength is made one in the range of 1.099 to 1.106 $\mu$m, ultraviolet light of a 7th harmonic in the range of 157 to 158 nm, that is, a wavelength substantially the same as that of an $F_2$ laser, is obtained. Note that as the single wavelength oscillation laser, a yttrium-doped fiber laser is used.

In the above embodiment, the wavelength of the illuminating light for exposure is of course not limited to 100 nm or more. For example, for exposure of a pattern of less than 70 nm, it is possible to use an SOR or plasma laser as a light source and generate EUV (extreme ultraviolet) light of a soft X-ray region (for example, wavelength band of 5 to 15 nm). An EUV exposure apparatus using an all reflection reduction optical system and a reflection type mask designed based on that exposure wavelength (for example, 13.5 nm) is being developed. In this apparatus, it may be considered to use arc illumination to synchronously scan the mask and wafer for scanning exposure, so this apparatus is also included in the scope of application of the present invention.

The projection optical system is not limited to a reduction system. An equal magnification system or an enlargement system (for example, an exposure apparatus for manufacturing a liquid crystal display etc.) may also be used.

Further, the present invention is not limited to just an exposure apparatus used for the manufacture of semiconductor devices. It may also be applied to an exposure apparatus for transferring a device pattern on to a glass plate, an exposure apparatus for transferring a device pattern on to a ceramic wafer as used in the manufacture of thin-film magnetic heads, an exposure apparatus used for manufacturing imaging elements (CCDs etc.), etc. Further, the present invention may also be applied to an exposure apparatus for transferring a circuit pattern on to a glass substrate or silicon wafer etc. for manufacturing a reticle or mask.

The exposure apparatus of the present embodiment may be produced by assembling an illumination optical system and a projection optical system comprised of a plurality of lenses in the exposure apparatus body and performing optical adjustment, attaching the reticle stage or wafer stage comprised of a large number of mechanical parts to the exposure apparatus body and connecting wiring and piping, and further performing overall adjustment (electrical adjustment, confirmation of operation, etc.) Note that the exposure apparatus is desirably manufactured in a clean room controlled in temperature and cleanness etc.

The semiconductor device is produced through a step of design of the functions and performance of the device, a step of fabrication of a reticle based on the design step, a step of fabricating a wafer from a silicon material, a step of exposure of a pattern of the reticle on the wafer by an exposure apparatus of the above embodiment, a step of assembly of the device (including dicing, bonding, and packaging), and an inspection step. As explained above, the present invention is not limited to the above embodiments. Further, it may be configured combining the embodiments as needed.

The present disclosure relates to subject matter contained in Japanese Patent Application No. HEI09-323245, filed on Nov. 25, 1997, the disclosure of which is expressly incorporated herein by reference in its entirety.

What is claimed is:

1. A projection exposure apparatus for transferring a pattern of a mask on to a substrate through a projection optical system, said projection exposure apparatus comprising:
   a barrel structure disposed between the mask and the substrate to hold the projection optical system, the barrel structure having a flange portion formed at an outer periphery thereof, a frame communicated with the flange portion to support the barrel structure, and a support member arranged to absorb stress caused by thermal transformation of the barrel structure and coupled to the outer periphery of the barrel structure without contacting the flange portion to support the barrel structure at a position different from the flange portion.

2. A projection exposure apparatus as set forth in claim 1, wherein said support member is integrally attached to the frame.

3. A projection exposure apparatus as set forth in claim 1, wherein the barrel structure is fastened to the support member by a connecting member having flexibility.

4. A projection exposure apparatus as set forth in claim 1, further comprising a first stage arranged at an object plane side of the projection optical system, a second stage arranged at an image plane side of the projection optical system, and a drive means coupled to the first stage and the second stage to drive the first and second stages so as to synchronously move said mask and said substrate by a ratio of speed in accordance with the magnification of the projection optical system.

5. A projection exposure apparatus as set forth in claim 1, further comprising a partition disposed on an outer periphery of the barrel to isolate a space including at least an outer periphery of the barrel from other spaces.

6. A projection exposure apparatus as set forth in claim 5, further comprising a gas feeder coupled to at least one of the barrel and the partition to feed an inert gas to at least one of the inside of said barrel and the inside of said partition.

7. A projection exposure apparatus as set forth in claim 6, wherein a passage connecting the inside of the barrel and the inside of the partition is formed at a portion of the barrel covered by the partition.

8. A projection exposure apparatus as set forth in claim 5, wherein at least part of the partition is a freely deformable variable partition.

9. A projection exposure apparatus as set forth in claim 8, wherein said variable partition is an accordion-like partition comprised of zigzag folds.

10. A projection exposure apparatus as set forth in claim 8, wherein said variable partition is a sheet-like partition having flexibility.

11. A projection exposure apparatus as set forth in claim 8, wherein part of the partition is fastened to said barrel.

12. A projection exposure apparatus as set forth in claim 8, wherein part of the partition is fastened to said frame.

13. A projection exposure apparatus as set forth in claim 1, wherein said projection optical system has a plurality of refraction optical members and a plurality of reflection optical members.

14. An exposure apparatus as set forth in claim 13, wherein the barrel structure has a plurality of mutually independent barrels to hold the projection optical system.

15. A projection exposure apparatus as set forth in claim 14, wherein:

said projection optical system has a first reflection optical element that bends an optical axis, a first optical system arranged between said mask and said first reflection optical element, and a second optical system arranged between the first reflection optical element and said substrate;

said plurality of barrels include a first barrel that holds the first optical system and a second barrel that holds the second optical system;

said frame integrally supports said first barrel and said second barrel; and said support member is a connecting member connecting said first barrel and said second barrel at positions different from the flange portion.

16. A projection exposure apparatus as set forth in claim 15, wherein:

said second optical system has a second reflection optical element that bends said optical axis and an optical axis between said second reflection optical element and said substrate becomes substantially parallel to the optical axis of the first optical system and the connecting member connects the first barrel and a part of the second barrel between the second reflection optical element and said substrate.

17. A projection exposure apparatus as set forth in claim 16, wherein said second barrel includes two barrels that holds an optical element arranged between said first and second reflection optical elements and an optical element arranged between said second reflection optical element and said substrate.

18. A projection exposure apparatus as set forth in claim 15, wherein said first reflection optical element has a concave mirror arranged with the reflection surface facing upward and is supported by said frame so that its optical axis becomes substantially parallel with the direction of gravity.

19. A projection exposure apparatus as set forth in claim 15, wherein said connecting member is fastened to said first barrel and said second barrel on a pair of common tangents connecting the outer periphery of the first barrel and the outer periphery of the second barrel.

20. A projection exposure apparatus as set forth in claim 19, wherein said connecting member comprises a rigid plate having a first fastening portion fastened with the first barrel and a second fastening portion fastened with the second barrel, at least one of the first fastening portion and the second fastening portion being made movable in the normal direction.

21. A projection exposure apparatus as set forth in claim 20, wherein at least one fastening portion of the rigid plate has a hinge movable in the normal direction.

22. A projection exposure apparatus as set forth in claim 20, wherein at least one fastening portion of the rigid plate has a thin portion movable in the normal direction.

23. A projection exposure apparatus as set forth in claim 19, wherein:

said connecting member is comprised of a rigid rod and said rigid rod is fastened to said first barrel and said second barrel on a pair of parallel common tangents connecting the outer periphery of said first barrel and the outer periphery of said second barrel and said first barrel and said second barrel are connected by a second connecting member on another common tangent connecting the outer periphery of the first barrel and the outer periphery of the second barrel.

24. A projection exposure apparatus as set forth in claim 15, wherein said frame and said connecting member are comprised by materials of substantially equal linear expansion coefficients.

25. An exposure apparatus for transferring a pattern of a mask on to a substrate, said exposure apparatus comprising:

a barrel structure having a flange portion formed at an outer periphery thereof and disposed between the mask and the substrate, a frame communicated with the flange portion to support the barrel structure at the flange portion, and a support member having a flexible member arranged to absorb stress caused by thermal transformation of the barrel structure and coupled to the barrel structure near one edge of the outer periphery of the barrel structure at a position different from the flange portion, the support member supporting the barrel structure through the flexible member.

26. An exposure apparatus as set forth in claim 25, wherein the support member supports the barrel structure near the mask side edge of the barrel structure.

27. An exposure apparatus as set forth in claim 25, wherein the support member is fastened to the frame.

28. An exposure apparatus as set forth in claim 25, wherein the barrel structure holds a projection optical system having a plurality of refraction optical members and a plurality of reflection optical members.

29. An exposure apparatus as set forth in claim 25, wherein the flexible member is a connecting member having flexibility.

* * * * *